US008251745B2

(12) United States Patent (10) Patent No.: US 8,251,745 B2
Johnescu et al. (45) Date of Patent: Aug. 28, 2012

(54) ELECTRICAL CONNECTOR SYSTEM WITH ORTHOGONAL CONTACT TAILS

(75) Inventors: Douglas M. Johnescu, York, PA (US); Steven E. Minich, York, PA (US); Stephen B. Smith, Mechanicsburg, PA (US)

(73) Assignee: FCI Americas Technology LLC, Carson City, NV (US)

( * ) Notice: Subject to any disclaimer, the term of this patent is extended or adjusted under 35 U.S.C. 154(b) by 0 days.

(21) Appl. No.: 12/186,064

(22) Filed: Aug. 5, 2008

(65) Prior Publication Data

US 2009/0117781 A1 May 7, 2009

Related U.S. Application Data

(60) Provisional application No. 60/986,223, filed on Nov. 7, 2007.

(51) Int. Cl.
*H01R 13/648* (2006.01)
(52) U.S. Cl. .................. 439/607.1; 439/61; 439/701
(58) Field of Classification Search .................. 439/61, 439/608, 607.1, 607.5, 701
See application file for complete search history.

(56) References Cited

U.S. PATENT DOCUMENTS

| 4,472,765 | A | 9/1984 | Hughes |
| 4,762,500 | A | 8/1988 | Dola et al. |
| 4,917,616 | A | 4/1990 | Demler, Jr. et al. |
| 5,094,623 | A | 3/1992 | Scharf et al. |
| 5,161,987 | A | 11/1992 | Sinisi |
| 5,766,023 | A | 6/1998 | Noschese et al. |
| 6,420,778 | B1 | 7/2002 | Sinyansky |
| 6,641,411 | B1 | 11/2003 | Stoddard et al. |
| 6,717,825 | B2 | 4/2004 | Volstorf |
| 6,851,980 | B2 * | 2/2005 | Nelson et al. ............. 439/607.05 |
| 6,960,103 | B2 | 11/2005 | Tokunaga |
| 7,090,501 | B1 | 8/2006 | Scherer et al. |
| 7,108,556 | B2 * | 9/2006 | Cohen et al. ............. 439/607.08 |
| 7,168,964 | B2 * | 1/2007 | Lemke et al. .................... 439/83 |
| 7,182,643 | B2 | 2/2007 | Winings et al. |
| 7,331,802 | B2 | 2/2008 | Rothermel et al. |
| 2006/0073709 | A1 | 4/2006 | Reid |
| 2006/0172608 | A1 | 8/2006 | Caveney |
| 2006/0228912 | A1 | 10/2006 | Morlion et al. |
| 2007/0099455 | A1 | 5/2007 | Rothermel |
| 2007/0149057 | A1 | 6/2007 | Cohen |
| 2008/0214059 | A1 | 9/2008 | Rothermel et al. |

FOREIGN PATENT DOCUMENTS

JP 14203623 7/2002

* cited by examiner

*Primary Examiner* — Truc Nguyen
(74) *Attorney, Agent, or Firm* — Woodcock Washburn LLP

(57) ABSTRACT

Disclosed are electrical connectors and methods of assembling an electrical connector having "standard" (i.e., with electrical contacts having in-line tails), jogged (i.e., with electrical contacts having jogged tails but not connected orthogonally to another connector through a substrate), and/or "orthogonal" (i.e., with electrical contacts having jogged tails that are used in an orthogonal application) leadframe assemblies in the same connector. This provides the flexibility of using some of the available contacts in an orthogonal application and, at the same time, having remaining contacts available for routing on the midplane PCB. Though this could be done using only orthogonal leadframe assemblies, the combination of standard leadframe assemblies with orthogonal leadframe assemblies creates additional spacing between the PCB vias, so that signal traces can be more easily routed on the midplane PCB.

9 Claims, 23 Drawing Sheets

FIG. 14E-A

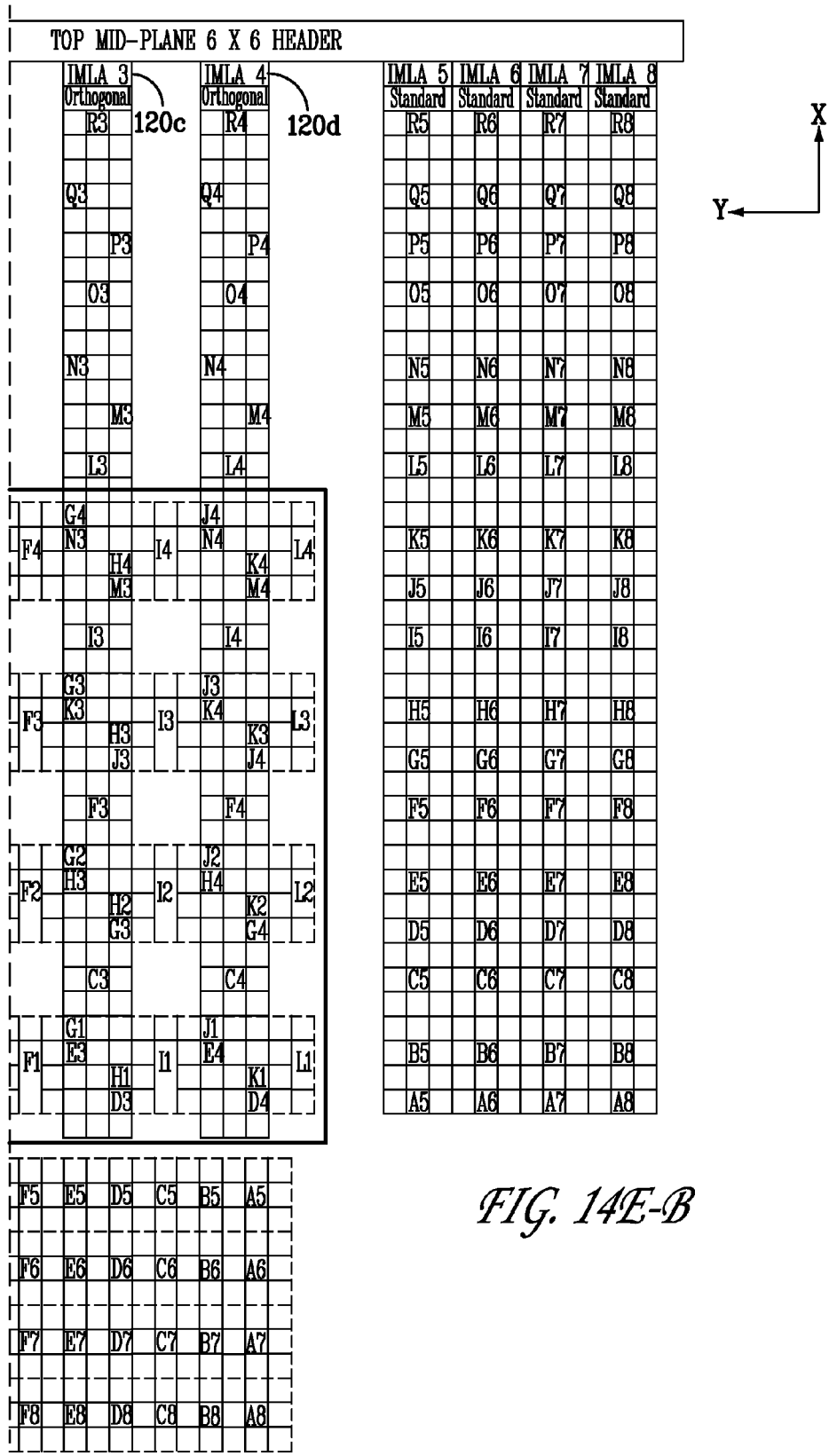
FIG. 14E-B

ELECTRICAL CONNECTOR SYSTEM WITH ORTHOGONAL CONTACT TAILS

CROSS-REFERENCE TO RELATED APPLICATIONS

This application claims benefit under 35 U.S.C. §119(e) of provisional U.S. patent application No. 60/986,223, filed Nov. 7, 2007, the contents of which are incorporated herein by reference in their entirety.

FIELD OF THE INVENTION

Generally, the invention relates to electrical connectors. More particularly, the invention relates to connector applications wherein orthogonally-mated connectors share common vias through a midplane. The invention further relates to electrical connectors incorporating different sized connectors on each side of a midplane.

BACKGROUND OF THE INVENTION

Electrical connectors may be used in orthogonal applications. In an orthogonal application, each of two connectors is mounted to a respective, opposite side of a so-called "midplane." The connectors are electrically coupled to one another through the midplane. A pattern of electrically conductive vias may be formed through the midplane. The terminal mounting ends of the contacts may be received into the vias. To reduce the complexity of the midplane, it is often desirable that the terminal mounting ends of the contacts from a first of the connectors be received into the same vias as the terminal mounting ends of the contacts from the other connector.

In traditional orthogonal electrical connector assemblies, two orthogonal connectors having the same number of contact leads are mounted to the midplane, one connector on each side of the midplane. However, this configuration may not allow for electrical connection of a connector contact to trace routing on the midplane PCB. Also, in traditional orthogonal electrical connector assemblies, only orthogonal leadframe assemblies are contained in each orthogonal connector. This configuration may limit the spacing between the PCB vias, which may limit the available channels for trace routing on the midplane PCB.

SUMMARY OF THE INVENTION

Disclosed are electrical connectors and methods of assembling an electrical connector having "standard" (i.e., with electrical contacts having in-line tails), jogged (i.e., with electrical contacts having jogged tails but not connected orthogonally to another connector through a substrate), and/or "orthogonal" (i.e., with electrical contacts having jogged tails that are used in an orthogonal application) leadframe assemblies in the same connector. This provides the flexibility of using some of the available contacts in an orthogonal application and, at the same time, having remaining contacts available for routing on the midplane PCB. Though this could be done using only orthogonal leadframe assemblies, the combination of standard leadframe assemblies with orthogonal leadframe assemblies creates additional spacing between the PCB vias, so that signal traces can be more easily routed on the midplane PCB.

DETAILED DESCRIPTION OF ILLUSTRATIVE EMBODIMENTS

Figure 1A:
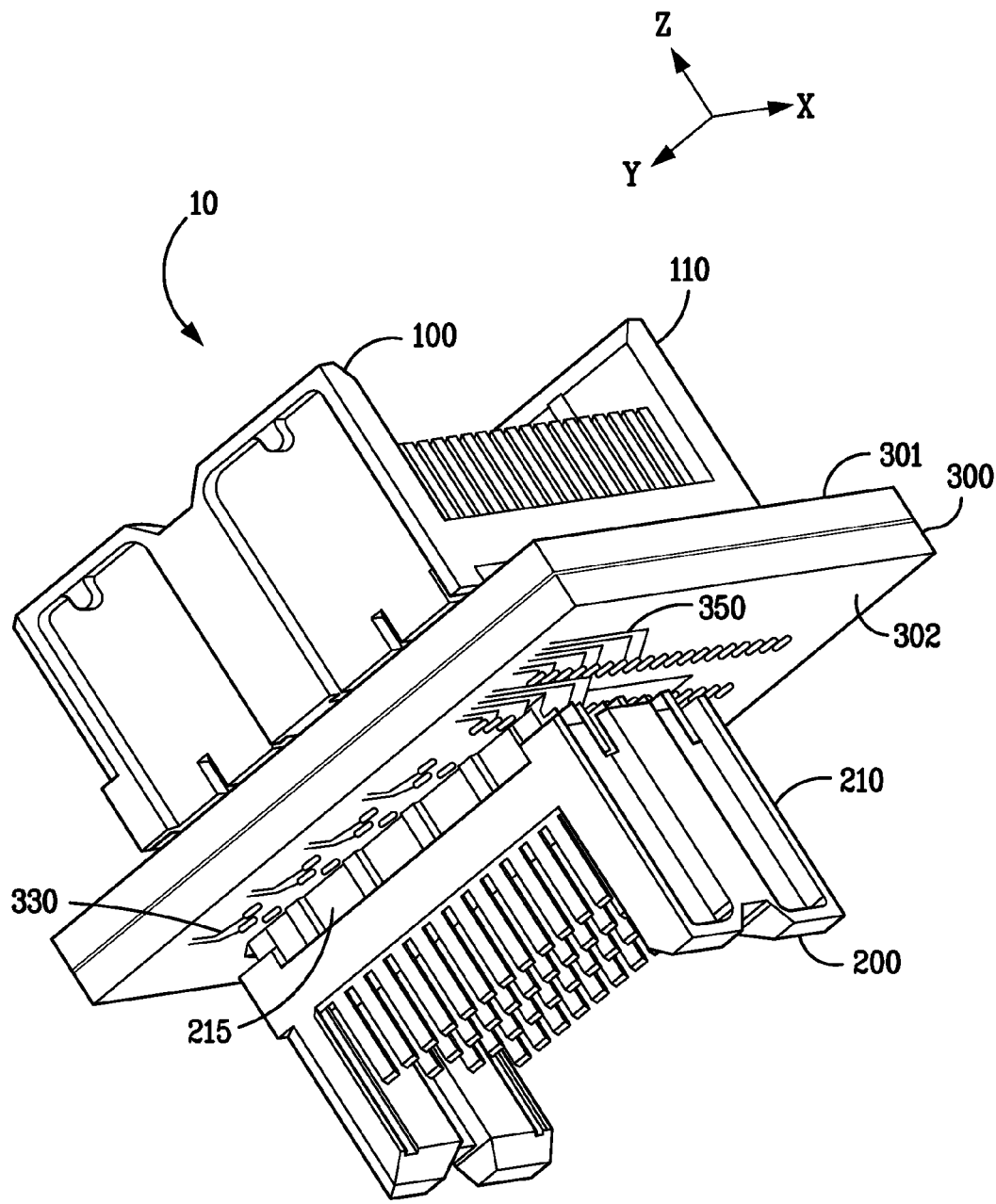
FIGS. 1A, 1B, and 1C depict perspective views of an example 4×4 orthogonal connector and 6×6 mixed connector mounted orthogonally to one another through the use of shared vias in a midplane.

FIGS. 1A through 9 depict various aspects of an example embodiment electrical connector system according to the invention. FIG. 1A depicts a perspective view of an example 4×4 orthogonal connector and 6×6 mixed connector mounted orthogonally to one another through the use of shared vias in a midplane.

Referring to FIG. 1A, an example first embodiment electrical connector system 10 includes a mixed leadframe connector 100, an orthogonal leadframe connector 200, and a midplane 300. Mixed leadframe connector 100 includes a leadframe housing 110. Orthogonal leadframe connector 200 includes a leadframe housing 210 that contains four (4)

orthogonal leadframe assemblies 215. Midplane 300 defines a first side 301 and a second side 302. Second side 302 includes (optionally) orthogonal via traces 330 and standard via traces 350, the traces 330 and 350 connecting to signal vias from the mixed leadframe connector. The traces 330 and 350 may be on the first side 301, the second side 320, or any layer of the PCB between the first side 301 and the second side 320.

Mixed leadframe connector 100 and orthogonal leadframe connector 200 are mounted orthogonally (e.g., connector 100 is rotated ninety degrees (90°) with respect to connector 200) to one another through the use of the shared orthogonal pattern of vias 320 in midplane 300. As shown in FIG. 1A, midplane 300 lies in a plane defined by the arrows designated X and Y shown in FIG. 1A. Mixed leadframe connector 100 is mounted on first side 301 of midplane 300, extending away from midplane 300 in the positive direction indicated by the arrow Z of FIG. 1A. Orthogonal leadframe connector 200 is mounted on second side 302 of midplane 300, extending away from midplane 300 in the negative Z direction, relative to mixed leadframe connector 100.

Figure 1B:
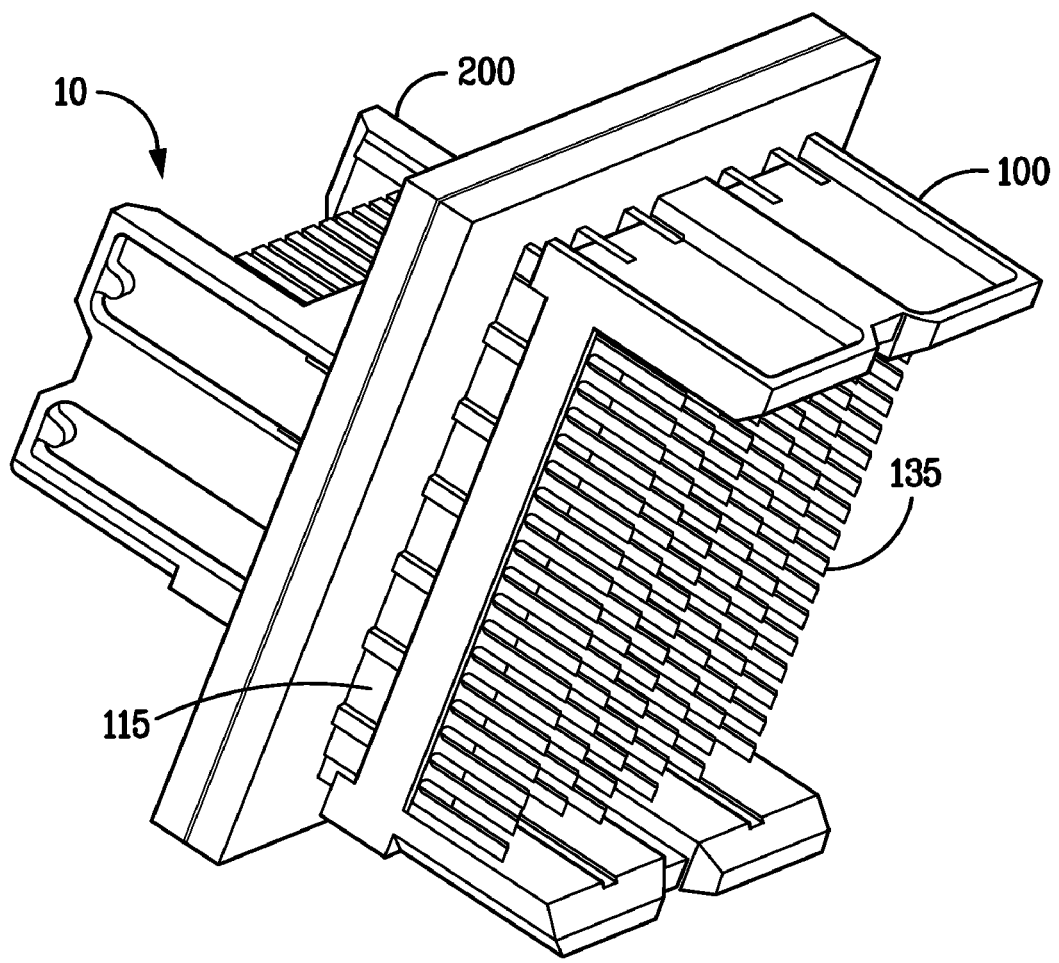

FIG. 1B depicts another perspective view of an example 4×4 orthogonal connector 200 and 6×6 mixed connector 100 mounted orthogonally to one another through the use of shared vias in a midplane. FIG. 1B allows mixed leadframe connector 100 to be seen from the side containing orthogonal leadframe assemblies 115. This view shows four orthogonal leadframe assemblies 115 and two standard leadframe assemblies 135 in mixed leadframe connector 100.

Figure 1C:
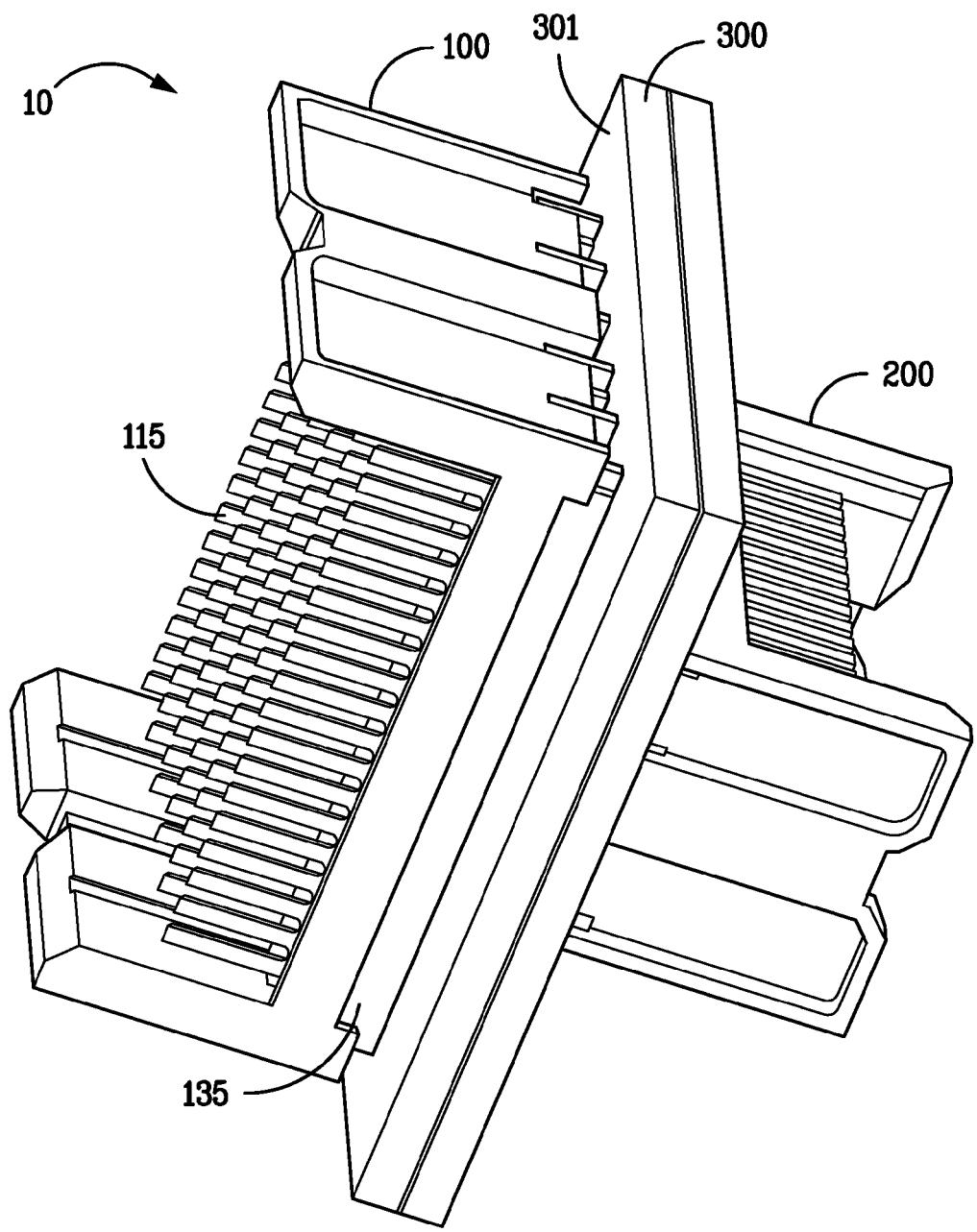

FIG. 1C depicts another perspective view of an example 4×4 orthogonal connector 200 with orthogonal leadframe assemblies 215 and 6×6 mixed connector 100 mounted orthogonally to one another through the use of shared vias in a midplane. FIG. 1C allows mixed leadframe connector 100 to be seen from the side containing standard leadframe assemblies 135, from the view of the first side 301 of midplane 300.

Figure 2A:
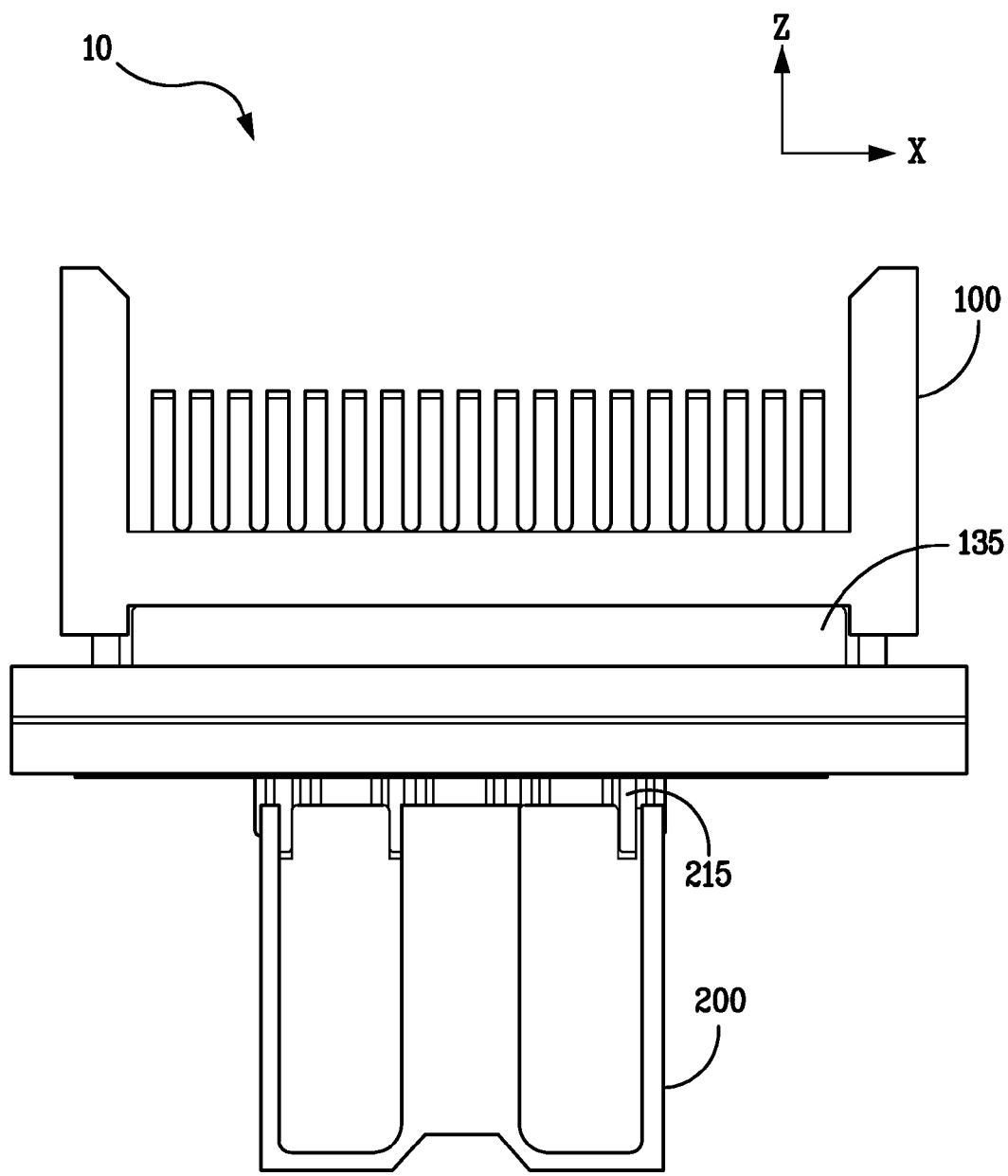
FIGS. 2A and 2B depict side views of the mounted connector pair.
Figure 2B:
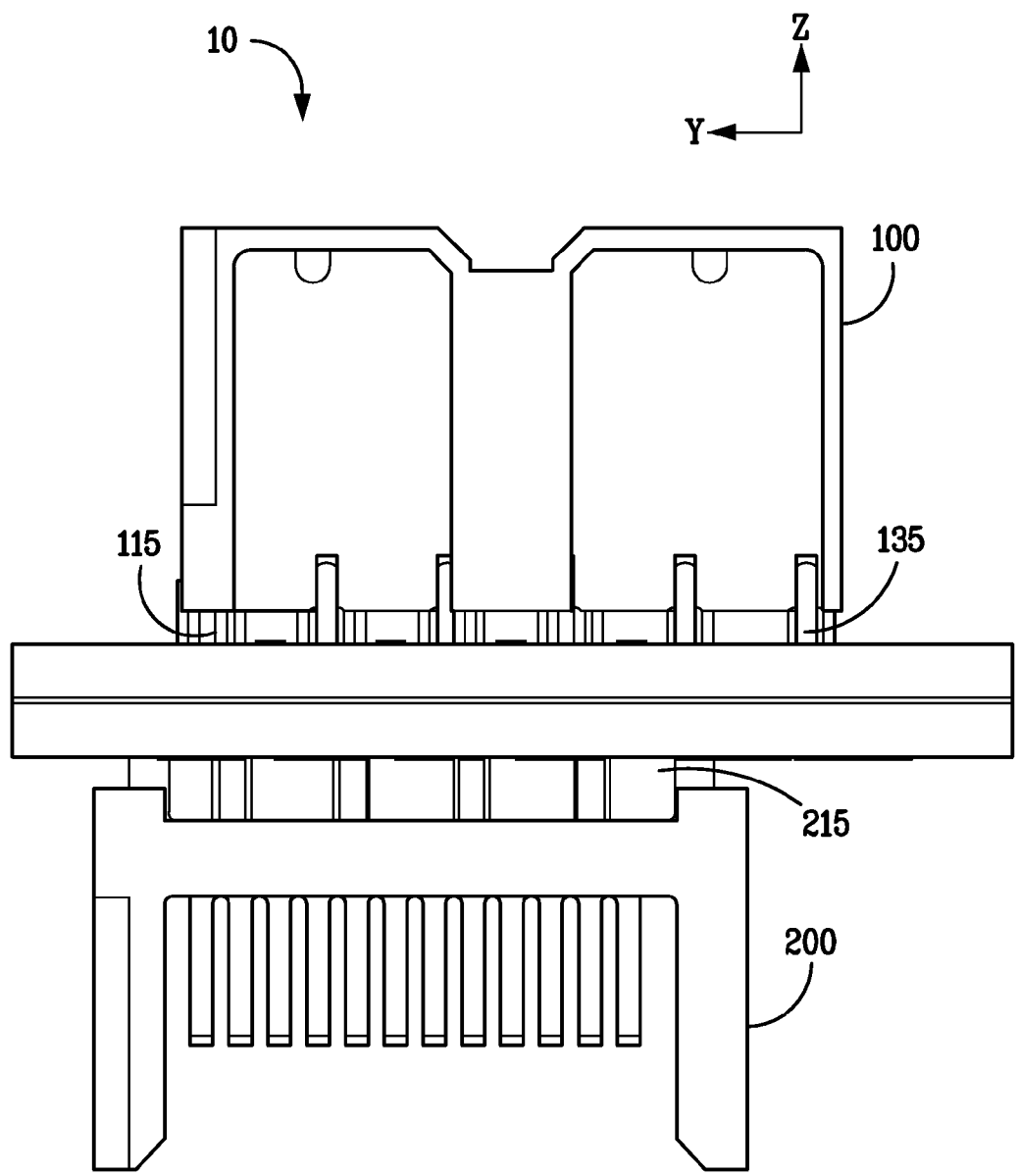

FIGS. 2A and 2B depict side views of the mounted connector pair. FIG. 2A depicts the mounted connector pair viewed in the X-Z plane, as defined by the coordinate axis arrows shown in FIG. 1A. FIG. 2A allows mixed leadframe connector 100 to be seen from the side containing standard leadframe assemblies 135. FIG. 2B depicts the mounted connector pair viewed in the Y-Z plane, as defined by the coordinate axis arrows shown in FIG. 1A. FIG. 2A allows orthogonal leadframe connector 200 to be seen from the side, where one of the orthogonal leadframe assemblies 215 can be seen.

Figure 3:
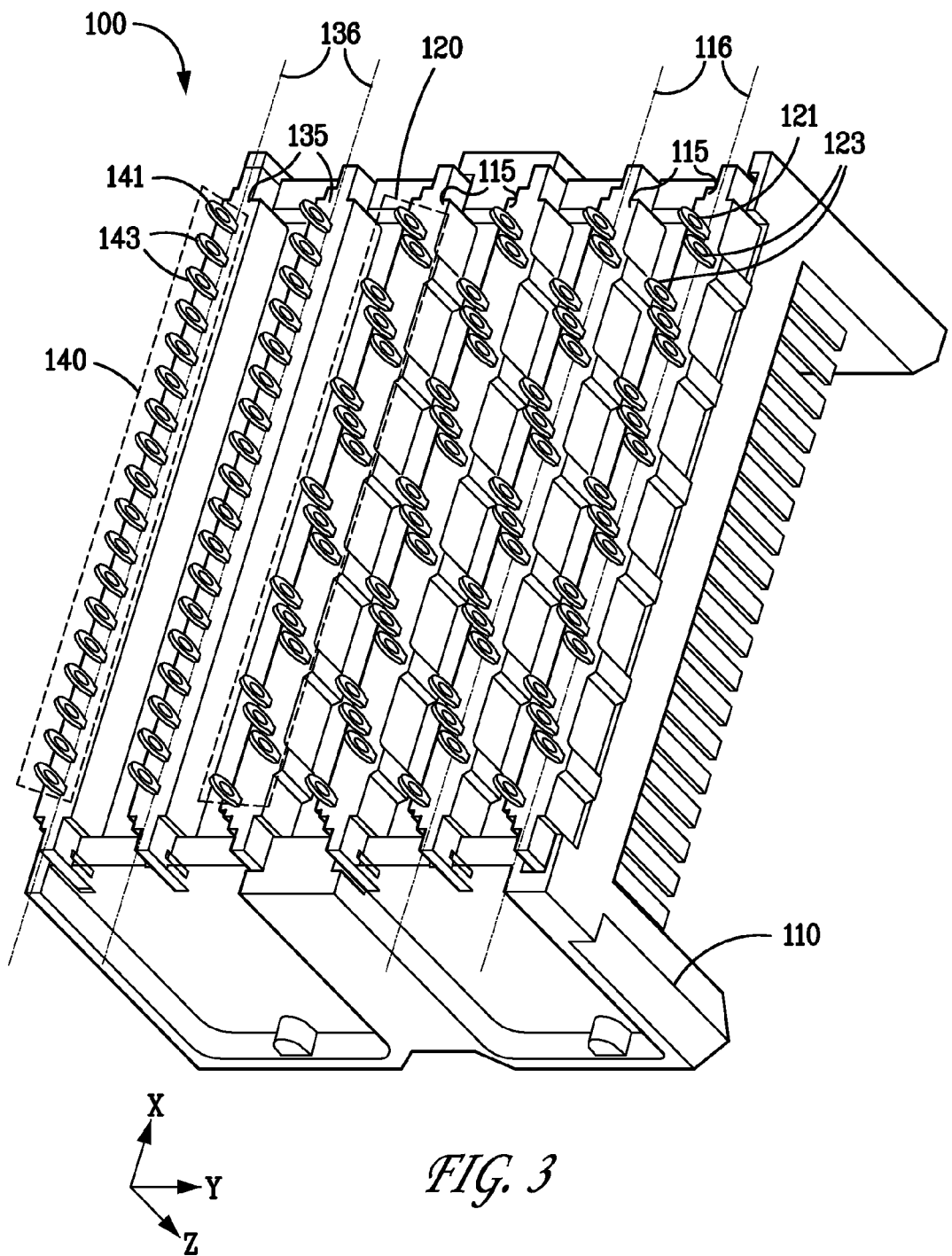
FIG. 3 depicts a perspective view of the mounting side of the 6×6 mixed connector.

FIG. 3 depicts a perspective view of the mounting side of the 6×6 mixed connector as the connector would be oriented and mounted to the first side of the midplane. In FIG. 3, the mounting side of the four (4) orthogonal leadframe assemblies 115 and two (2) standard leadframe assemblies 135 can be seen, as they are positioned within leadframe housing 110 of mixed leadframe connector 100. Each orthogonal leadframe assembly 115 extends in the direction indicated by the arrow X of FIG. 1A and includes an orthogonal column of contact tails 120. Each orthogonal column of contact tails 120 extends in the direction indicated by the arrow X of FIG. 1A and includes ground contact tails 121 and signal contact tails 123. Each standard leadframe assembly 135 extends in the direction indicated by the arrow X of FIG. 1A and includes a standard column of contact tails 140. Each standard column of contact tails 140 extends in the direction indicated by the arrow X of FIG. 1A and includes ground contact tails 141 and signal contact tails 143. Of course, the designation of the direction of columns is arbitrary.

Contact tails 121, 123, 141, and 143, as shown in FIG. 3 and other figures, may be freely assigned as ground or signal contact tails, depending on the desired function of connector system 10. In other embodiments, contact tails 121, 123, 141, and 143 may all be ground contact tails, they may all be signal contact tails, or they may be various combinations of ground and signal contact tails. The assignment of contact tails 121 and 141 as ground contact tails and contact tails 123 and 143 as signal contact tails merely illustrates the contact tail assignments in a preferred embodiment. Also, multiple contact tails 123 or 143 may be signal contact tails and they may form differential signal pairs. However, this is optional, as some of the contact tails 123 and 143 may form differential signal pairs, while others may not form differential signal pairs. In other embodiments, there may be no differential signal pairs, or all contact tails 123 and 143 may form differential signal pairs, depending on the desired function of connector system 10.

In the embodiment shown in FIG. 3, a mixed leadframe connector 100 may include at least one standard leadframe assembly 135, extending along a first direction (in the direction indicated by the arrow X of FIG. 1A), and having a first contact (either 141 or 143) and a second contact (either 141 or 143) adjacent the first contact along the first direction. In this embodiment, a mixed leadframe connector 100 may also include at least one orthogonal leadframe assembly 115, extending along the first direction (in the direction indicated by the arrow X of FIG. 1A), and having a third contact (either 121 or 123) and a fourth contact (either 121 or 123) along a second direction that is different from the first direction.

Each orthogonal leadframe assembly 115 may either be "orthogonal" (i.e., with electrical contacts having a jogged configuration or footprint that are used in an orthogonal application) or jogged (i.e., with electrical contacts having a jogged configuration or footprint but not connected orthogonally to another connector through a substrate). Whether each orthogonal leadframe assembly 115 is assigned to be orthogonal or jogged will depend on the projected use and requirements of the electrical connector system 10.

Each orthogonal leadframe assembly 115, whether it is used in an orthogonal application or not, may contain one or more differential signal pairs including first and second contacts (either 121 or 123), the first and second contacts positioned on opposite sides of a common centerline 116. Each orthogonal leadframe assembly 115 may also contain a ground contact (either 121 or 123) adjacent the second contact that may be positioned along the common centerline 116. The first and second contacts and the ground contact may together form a jogged configuration or footprint of contacts, where each successive contact along the common centerline 116 alternates among being positioned to one side of the centerline 116, to the other side of the centerline 116, and along the centerline 116.

Each standard leadframe assembly 136 may contain one or more differential signal pair including first and second contacts (either 121 or 123), the first and second contacts positioned along a common centerline 136. Each standard leadframe assembly 135 may also contain a ground contact (either 121 or 123) adjacent the second contact that may be positioned along the common centerline 136. The first and second contacts and the ground contact may together form a standard or straight configuration, where each successive contact is positioned approximately along the common centerline 136.

In some embodiments, each orthogonal leadframe assembly 115 and/or each standard leadframe assembly 135 may comprise a single section or piece that may be inserted into the leadframe housing 110 of the mixed leadframe connector 100. In other embodiments, each orthogonal leadframe assembly 115 and/or each standard leadframe assembly 135 may comprise two dielectric sections that fit together. Each orthogonal leadframe assembly 115 and standard leadframe assembly 135 may comprise any number of sections that fit together, depending on the particular desired use and cost of electrical connector system 10.

Preferably, the mixed leadframe connector 100 does not contain metallic plates between any of the orthogonal leadframe assemblies 115 or any of the standard leadframe assemblies 135 or between any the leadframe assemblies 115 and 135. In other embodiments, the mixed leadframe connector 100 may contain one or more metallic plates between the orthogonal leadframe assemblies 115 or the standard leadframe assemblies 135 or between any the leadframe assemblies 115 and 135. The use or absence of metallic plates in the mixed leadframe connector 100 will depend on the particular desired use, dimensions, and performance requirements of electrical connector system 10.

In this embodiment, each orthogonal column of contact tails 120 contains six ground contact tails 121 and six pairs of signal contact tails 123. Each ground contact tail 121 is followed in the column by a pair of signal contact tails 123. Each orthogonal column of contact tails 120 generally proceeds in the X direction, as defined by the coordinate axis arrows shown in FIG. 1A, but each signal contact tail 123 has a positive or negative Y direction offset relative to each ground contact tail 121. In this embodiment, each standard column of contact tails 140 contains six ground contact tails 141 and six pairs of signal contact tails 143. Each ground contact tail 141 is followed in the column (in the X direction) by a pair of signal contact tails 143.

Figure 4:
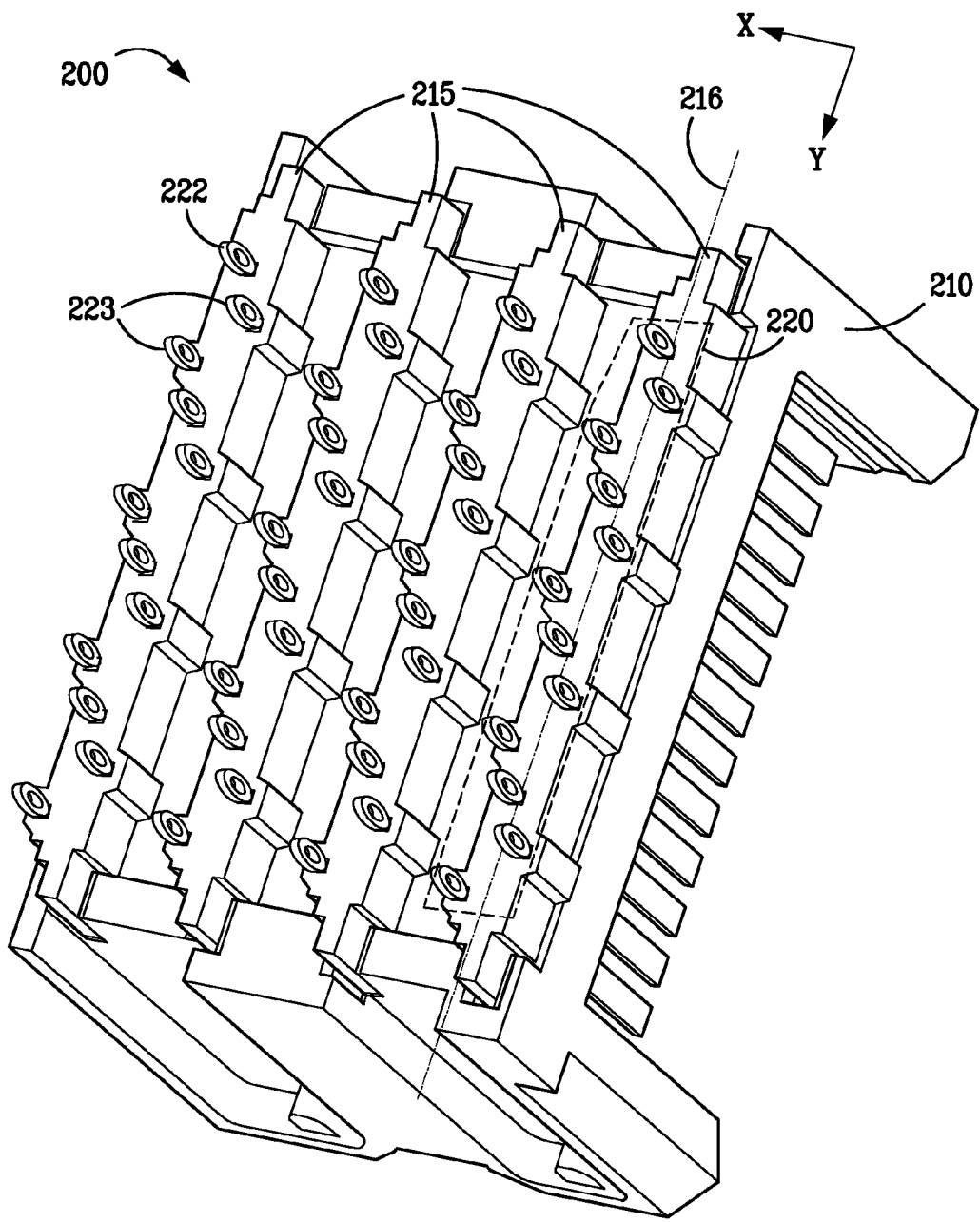
FIG. 4 depicts a perspective view of the mounting side of the 4×4 orthogonal connector.

FIG. 4 depicts a perspective view of the mounting side of the 4×4 orthogonal connector as the connector would be oriented and mounted to the second side of the midplane. In FIG. 4, the mounting side of the four (4) orthogonal leadframe assemblies 215 can be seen, as they are positioned within leadframe housing 210 of orthogonal leadframe connector 200. Each orthogonal leadframe assembly 215 extends in the direction indicated by the arrow Y of FIG. 1A and includes an orthogonal column of contact tails 220. Each orthogonal column of contact tails 220 extends in the direction indicated by the arrow Y of FIG. 1A and includes ground contact tails 222 and signal contact tails 223. Of course, the designation of the direction of columns is arbitrary.

Contact tails 222 and 223, as shown in FIG. 4 and other figures, may be freely assigned as ground or signal contact tails, depending on the desired function of connector system 10. In other embodiments, contact tails 222 and 223 may all be ground contact tails, they may all be signal contact tails, or they may be various combinations of ground and signal contact tails. The assignment of contact tails 222 as ground contact tails and contact tails 223 as signal contact tails merely illustrates the contact tail assignments in a preferred embodiment. Also, multiple contact tails 223 may be signal contact tails and they may form differential signal pairs. However, this is optional, as some of the contact tails 223 may form differential signal pairs, while others may not form differential signal pairs. In other embodiments, there may be no differential signal pairs, or all contact tails 223 may form differential signal pairs, depending on the desired function of connector system 10.

Each orthogonal leadframe assembly 215 may either be "orthogonal" (i.e., with electrical contacts having a jogged configuration or footprint that are used in an orthogonal application) or jogged (i.e., with electrical contacts having a jogged configuration or footprint but not connected orthogonally to another connector through a substrate). Whether each orthogonal leadframe assembly 215 is assigned to be orthogonal or jogged will depend on the projected use and requirements of the electrical connector system 10.

Each orthogonal leadframe assembly 215, whether it is used in an orthogonal application or not, may contain one or more differential signal pairs including first and second contacts (either 222 or 223), the first and second contacts positioned on opposite sides of a common centerline 216. Each orthogonal leadframe assembly 215 may also contain a ground contact (either 222 or 223) adjacent the second contact that may be positioned along the common centerline 216. The first and second contacts and the ground contact may together form a jogged configuration or footprint of contacts, where each successive contact along the common centerline 216 alternates among being positioned to one side of the centerline 216, to the other side of the centerline 216, and along the centerline 216.

In some embodiments, each orthogonal leadframe assembly 215 may comprise a single section or piece that may be inserted into the leadframe housing 210 of the orthogonal leadframe connector 200. In other embodiments, each orthogonal leadframe assembly 215 may comprise two dielectric sections that fit together. Each orthogonal leadframe assembly 215 may comprise any number of sections that fit together, depending on the particular desired use and cost of electrical connector system 10.

Preferably, the orthogonal leadframe connector 200 does not contain metallic plates between any of the orthogonal leadframe assemblies 215. In other embodiments, the mixed leadframe connector 200 may contain one or more metallic plates between the orthogonal leadframe assemblies 215. The use or absence of metallic plates in the orthogonal leadframe connector 200 will depend on the particular desired use, dimensions, and performance requirements of electrical connector system 10.

In this embodiment, each orthogonal column of contact tails 220 contains four ground contact tails 221 and four pairs of signal contact tails 223. Each ground contact tail 221 is followed in the column by a pair of signal contact tails 223. Each orthogonal column of contact tails 220 generally proceeds in the Y direction, as defined by the coordinate axis arrows shown in FIG. 1A, but each signal contact tail 223 has a positive or negative X direction offset relative to each ground contact tail 221.

Figure 5:
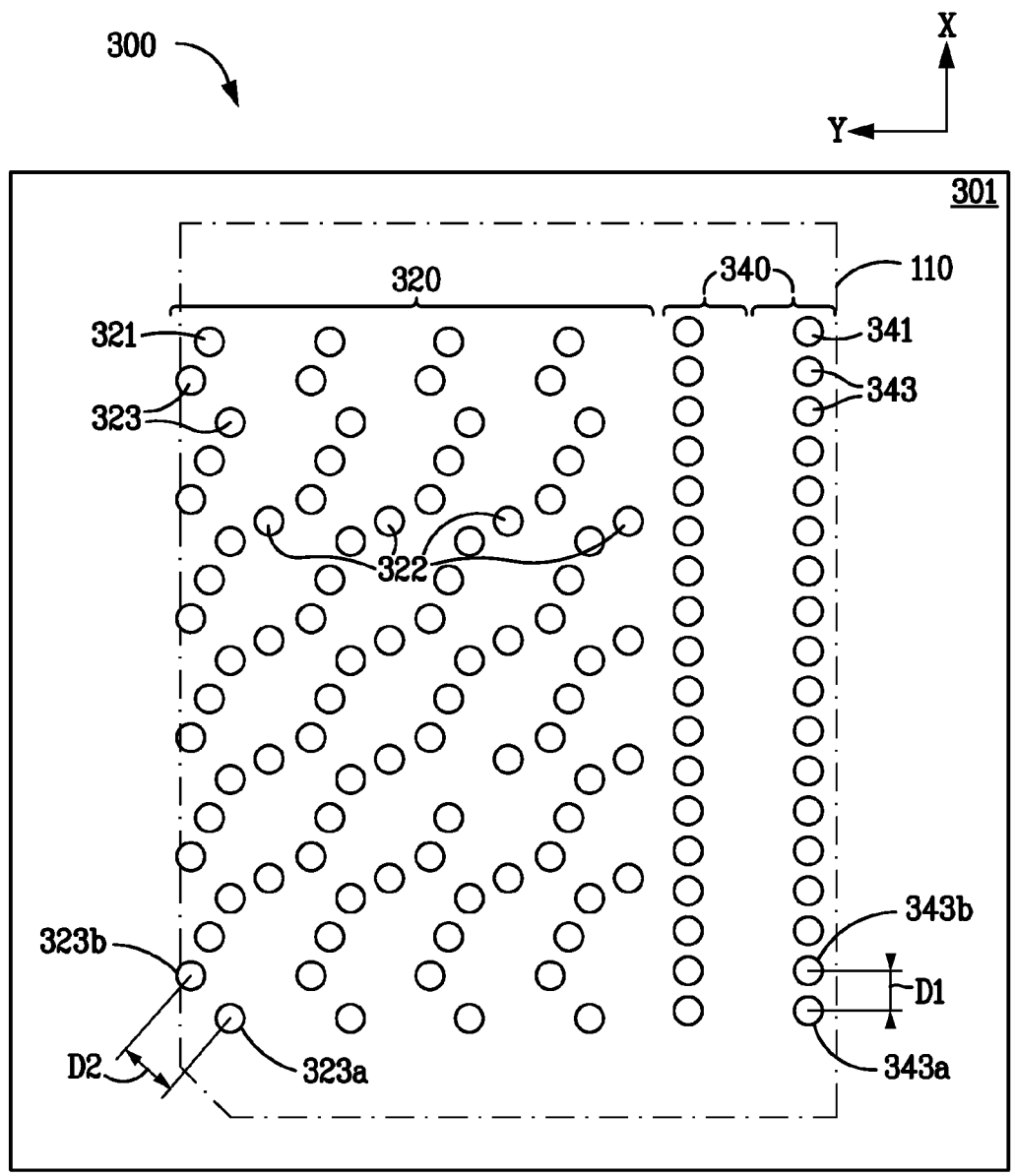
FIG. 5 depicts an via footprint of a midplane for receiving the contact tails of the 6×6 mixed connector (the outline of which is shown in dashed line) mounted to the first side of the midplane.

FIG. 5 depicts an via footprint of a midplane for receiving the contact tails of the 6×6 mixed connector (the outline of which is shown in dashed line) mounted to the first side of the midplane. In FIG. 5, first side 301 of midplane 300 is shown, viewed in the X-Y plane, as defined by the coordinate axis arrows shown in FIG. 1A. First side 301 is the side that is adapted to mate with mixed leadframe connector 100. The dashed line represents the outside boundaries in the X-Y plane of leadframe housing 110 of mixed leadframe connector 100. Midplane 300 further defines an orthogonal pattern of vias 320 that extend from first side 301 to second side 302, and two standard columns of vias 340 that extend from first side 301 to second side 302. Orthogonal pattern of vias 320 includes first side ground vias 321, second side ground vias 322, and signal vias 323. Standard columns of vias 340 include first side ground vias 341 and signal vias 343.

Vias 321, 322, 323, 341, and 343, as shown in FIG. 5 and other figures, may be freely assigned as ground or signal vias, depending on the desired function of connector system 10. In other embodiments, contact tails 321, 322, 323, 341, and 343 may all be ground vias, they may all be signal vias, or they may be various combinations of ground and signal vias. The assignment of vias 321, 322, and 341 as ground vias and contact tails 323 and 343 as signal vias merely illustrates the via assignments in a preferred embodiment. Also, multiple vias 323 or 343 may be signal vias, which may be adapted to receive differential signal pair contact tails. However, this is optional, as some of the vias 323 and 343 may be adapted to receive differential signal pair contact tails, while others may not be adapted to receive differential signal pair contact tails. In other embodiments, there may be no vias that are adapted to receive differential signal pair contact tails, or all vias 323 and 343 may be adapted to receive differential signal pair contact tails, depending on the desired function of connector system 10.

In the embodiment shown in FIG. 5, a midplane 300 may include a first side 301 and a second side 302 opposing the first side. Midplane 300 may also include a first via (either 341 or 343) extending from first side 301 to second side 302, and a second via (either 341 or 343) adjacent the first via along a first direction (in the direction indicated by the arrow X of FIG. 1A). In this embodiment, a midplane 300 may also include a third via (any of 321, 322, 323), and a fourth via (any of 321, 322, 323) adjacent the third via along a second direction different than the first direction.

As shown in FIG. 5, the first via may be 343a, the second via may be 343b, the third via may be 323a, and the fourth via may be 323b. In some embodiments, each of the first, second, third, and fourth vias may define respective first, second, third, and fourth centers. A distance D1 from the first center of first via 343a to the second center of second via 343b is less than a distance from the first center of first via 343a to a center of any other via in midplane 300 (e.g., first via 343a and second via 343b are successive vias, in the direction indicated by the arrow X of FIG. 1A, in a standard column of vias 340). A distance D2 from the third center of third via 323a to the fourth center of fourth via 323b is less than a distance from the third center of third via 323a to a center of any other via in midplane 300 (e.g., third via 343a and fourth via 343b are adjacent vias, located within an orthogonal pattern of vias 320).

In some embodiments, the first and second vias may be adapted to receive respective first and second contacts (either 141 or 143) that form a first differential signal pair of an electrical connector 100 when the electrical connector 100 is mounted to the first side 301 of the midplane 300. Also, the third and fourth vias may be adapted to receive respective third and fourth contacts (either 121 or 123) that form a second differential pair of the electrical connector 100.

Mixed leadframe connector 100 defines orthogonal columns of contact tails 120 and standard columns of contact tails 140 that are adapted to mount, respectively, onto the orthogonal pattern of vias 320 and the standard columns of vias 340 defined by midplane 300, as viewed from first side 301.

In this embodiment, at the first side 301 of midplane 300, each first side ground via 321 and each signal via 323 within the orthogonal pattern of vias 320 is adapted to receive, respectively, a ground contact tail 121 and a signal contact tail 123, from the orthogonal columns of contact tails 120, from connector 100 (shown in FIG. 3).

In this embodiment, there are enough vias 321 and 323 to allow for respective mating, at first side 301, with the contact tails 121 and 123 contained within the four orthogonal columns of contact tails 120, which allows the four orthogonal leadframe assemblies 115 of connector 100 to be mounted onto first side 301 of midplane 300. However, in other embodiments, some contact tails 121 and 123 may be devoid of reception into a corresponding via 321 or 323, and some vias 321 and 323 may be devoid of a contact tail 121 or 123.

Each second side ground via 322 remains devoid of receiving a contact tail at first side 301, from connector 100. These second side ground vias 322 are used to provide grounding for orthogonal leadframe connector 200 (shown in FIG. 4), which is mounted at second side 302.

In this embodiment, at the first side 301 of midplane 300, each first side ground via 341 and each signal via 343 within the standard columns of vias 340 is adapted to receive, respectively, a ground contact tail 141 and a signal contact tail 143, from the standard columns of contact tails 140, from connector 100 (shown in FIG. 3).

In this embodiment, there are enough vias 341 and 343 to allow for respective mating, at side 301, with the contact tails 141 and 143 contained within the two standard columns of contact tails 140, which allows the two standard leadframe assemblies 135 of connector 100 to be mounted onto first side 301 of midplane 300. However, in other embodiments, some contact tails 141 and 143 may be devoid of reception into a corresponding via 341 or 343, and some vias 341 and 343 may be devoid of a contact tail 141 or 143.

Figure 6:
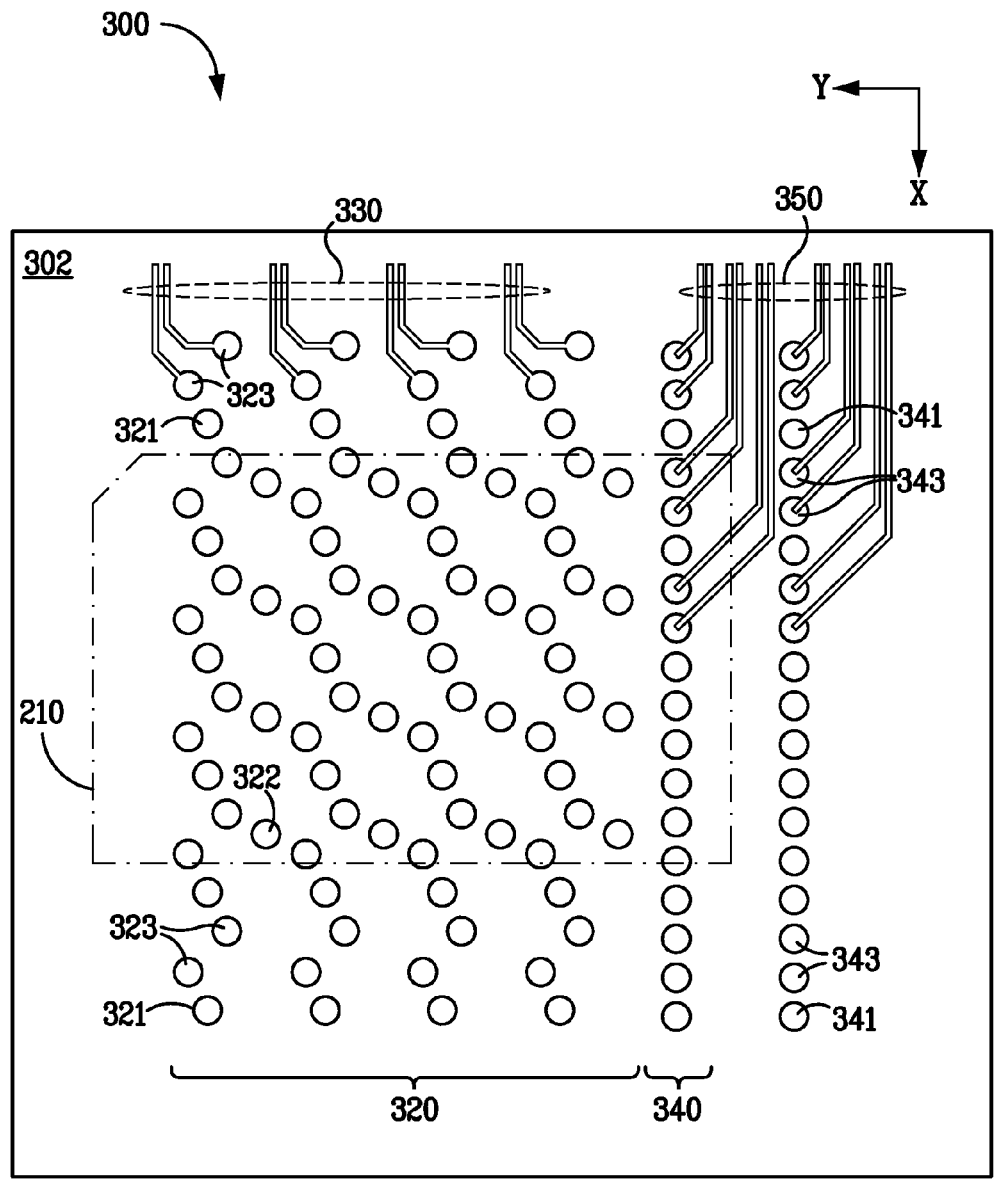
FIG. 6 depicts an via footprint of a midplane for receiving the contact tails of the 4×4 orthogonal connector (the outline of which is shown in dashed line) mounted to the second side of the midplane.

FIG. 6 depicts an via footprint of a midplane for receiving the contact tails of the 4×4 orthogonal connector (the outline of which is shown in dashed line) mounted to the second side of the midplane. In FIG. 6, second side 302 of midplane 300 is shown, viewed in the X-Y plane, as defined by the coordinate axis arrows shown in FIG. 1A. Second side 302 is the side that is adapted to mate with orthogonal leadframe connector 200 (shown in FIG. 4). The dashed line represents the outside boundaries in the X-Y plane of leadframe housing 210 of orthogonal leadframe connector 200. Second side 302 includes (optionally) orthogonal via traces 330 that originate from the orthogonal pattern of vias 320 and (optionally) standard via traces 350 that originate from the standard columns of vias 340.

Orthogonal leadframe connector 200 defines orthogonal columns of contact tails 220 that are adapted to mount onto a portion of the orthogonal pattern of vias 320 defined by midplane 300, as viewed from second side 302.

In this embodiment, at the second side 302 of midplane 300, each second side ground via 322 within the orthogonal pattern of vias 320 is adapted to receive a ground contact tail 222, from connector 200 (shown in FIG. 4). At the second side 302, some of the signal vias 323 within the orthogonal pattern of vias 320 receive a signal contact tail 223, from connector 200.

In this embodiment, there are enough vias 322 and 323 to allow for respective mating, at second side 302, with the contact tails 222 and 223 contained within the four orthogonal columns of contact tails 220, which allows the four orthogonal leadframe assemblies 215 of connector 200 to be mounted onto second side 302 of midplane 300. However, in other embodiments, some contact tails 222 and 223 may be devoid of reception into a corresponding via 322 or 323, and the number of vias 322 and 323 that are devoid of a contact tail 222 or 223 may vary, depending on the application.

Each first side ground via 321 remains devoid of receiving a contact tail at second side 302, from connector 200. These first side ground vias 321 are used to provide grounding for mixed leadframe connector 100 (shown in FIG. 3), which is mounted at first side 301. Also, although each of the signal contact tails 223 is received into a signal via 323, some of the signal vias 323 (specifically, in this embodiment, those that fall outside of the dashed line that represents the outside boundaries in the X-Y plane of leadframe housing 210) may (optionally) remain devoid of receiving any contact tails at second side 302, from connector 200. These signal vias 323 that are devoid of a contact tail at second side 302 are only used to mate with signal contact tails 123 from mixed leadframe connector 100 at first side 301.

As shown in FIG. 6, the portion of the signal vias 323 that are devoid of receiving any contact tails at second side 302, from connector 200 (those that fall outside of the dashed line that represents the outside boundaries of leadframe housing 210 of orthogonal leadframe connector 200), allow the corresponding signal contact tails 123 from connector 100 to be (optionally) electrically connected to respective orthogonal via traces 330 that originate from these respective signal vias 323.

The extra space made available on the second side 302 of midplane 300 (and/or the first side 301 in other embodiments), due to a portion of the signal vias 323 within the orthogonal pattern of vias 320 being unoccupied on second side 302, allows for increased routing space on second side 302 or any layer of the PCB for orthogonal via traces 330 (i.e., traces on second side 302 that are electrically connected to connector 100 through use of signal vias 323), around the orthogonal pattern of vias 320.

Each first side ground via 341 and signal via 343 within the two standard columns of vias 340 remains devoid of receiving a contact tail at second side 302, from connector 200. These standard columns of vias 340 are only used to mate with the standard columns of contact tails 140 from mixed leadframe connector 100 (shown in FIG. 3), which is mounted at first side 301.

As shown in FIG. 6, having the signal vias 323 within the standard columns of vias 340 remain devoid of receiving any contact tails at second side 302, from connector 200, allows the corresponding signal contact tails 143 from the standard columns of contact tails 140 from connector 100 to be (optionally) electrically connected to respective standard via traces 350 that originate from these respective signal vias 343.

The extra space made available on the second side 302 of midplane 300 (and/or the first side 301 in other embodiments), due to the signal vias 343 within the standard columns of vias 340 being unoccupied on second side 302, allows for increased routing space on second side 302 for standard via traces 350 (i.e., traces on second side 302 that are electrically connected to connector 100 through use of signal vias 343), around the standard columns of vias 340.

Figure 7:
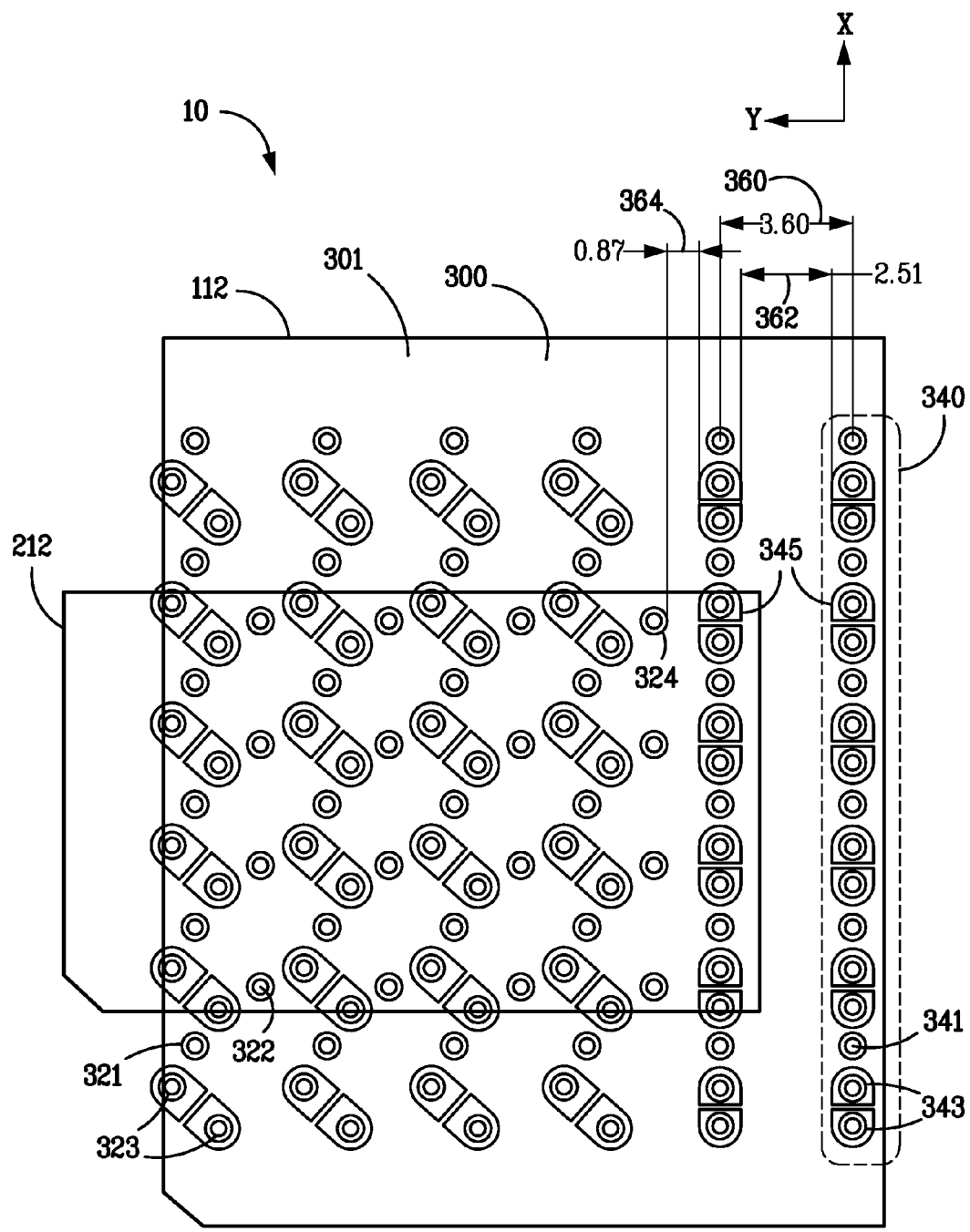
FIG. 7 depicts a midplane showing a footprint arrangement for a 6×6 mixed connector, wherein the location of a 4×4 orthogonal connector on the opposite side is shown.

FIG. 7 depicts a midplane showing a footprint arrangement for a 6×6 mixed connector, wherein the location of a 4×4 orthogonal connector on the opposite side is shown. FIG. 7 shows the midplane footprint from the view of first side 301 of midplane 300, and the outer boundaries of leadframe housings 110 and 210 are shown in solid lines 112 and 212, respectively. As shown in FIG. 7, the presence of standard columns of vias 340 that are devoid of receiving any contact tails at second side 302 from connector 200 allows for increased trace routing space on second side 302 or on any layer of the PCB.

In this embodiment, the standard columns of vias 340 are spaced 3.60 millimeters apart (standard via column center spacing 360). This standard via column center spacing 360, measured along the direction indicated by the arrow Y of FIG. 1A, represents the distance from the center of one first side ground via 341 or signal via 343 in one standard column of vias 340 to the center of a corresponding first side ground via 341 or signal via 343 in another standard column of vias 340. Of course, standard via column center spacing 360 may be any value, depending on the desired arrangement of signal contact tails 143 within the standard columns of contact tails 140.

Also shown in FIG. 7 are standard via trace routing channel 362 and orthogonal via trace routing channel 364. In this embodiment, standard via trace routing channel 362 is 2.51 millimeters, and orthogonal via trace routing channel 364 is 0.87 millimeters. Standard via trace routing channel 362 is the inner portion of standard via column center spacing 360 that lies between the outer boundaries of the signal via anti-pads 345 in the two standard columns of vias 340. Of course, standard via trace routing channel 362 may be any value, depending on the desired arrangement of signal contact tails 143 within the standard columns of contact tails 140 and on the desired anti-pad 345 width.

Also, although not shown in FIG. 7, there may be additional trace routing space for more standard via traces 350 on second side 302 of midplane 300 to the outside of the outer boundary of leadframe housing 110 of connector 100. This additional trace routing space available in this embodiment can best be seen in FIG. 6, where three pairs of standard via traces 350 are shown within standard via trace routing channel 362, and three additional standard via traces 350 are shown towards the outer edge of midplane 300, extending from the outer standard column of vias 340.

In this embodiment, orthogonal via trace routing channel 364 is the distance from the outer boundaries of the signal via anti-pads 345 in the innermost standard columns of vias 340 to the outer boundaries of the closest ground via anti-pads 324 of the orthogonal pattern of vias 320. Of course, orthogonal via trace routing channel 364 may be any value, depending on the desired arrangement of signal contact tails 123 within the orthogonal columns of contact tails 120 and signal contact tails 143 within the standard columns of contact tails 140. Although orthogonal via traces 330 are not shown routed through orthogonal via trace routing channel 364 in FIG. 7, there may be enough room within orthogonal via trace routing channel 364 for orthogonal via traces 330 that may be desired in other embodiments.

Also, although not shown in FIG. 7, there may be additional trace routing space for more orthogonal via traces 350 on the second side 302 or layers of midplane 300 to the outside of the outer boundary of leadframe housing 210 of connector 200. This additional trace routing space available in this embodiment can best be seen in FIG. 6, where four pairs of orthogonal via traces 330 are shown towards the outer edge of midplane 300, extending from the outermost signal vias 323 in the orthogonal pattern of vias 320. Further, although not shown in FIG. 6 or 7, there may be additional trace routing space for four more pairs of orthogonal via traces 330, extending from the outermost signal vias 323 on the opposite side of the orthogonal pattern of vias 320 (the signal vias 323 closest to the bottom of FIG. 6), also outside the outer boundary of leadframe housing 210 of connector 200.

Figure 8:
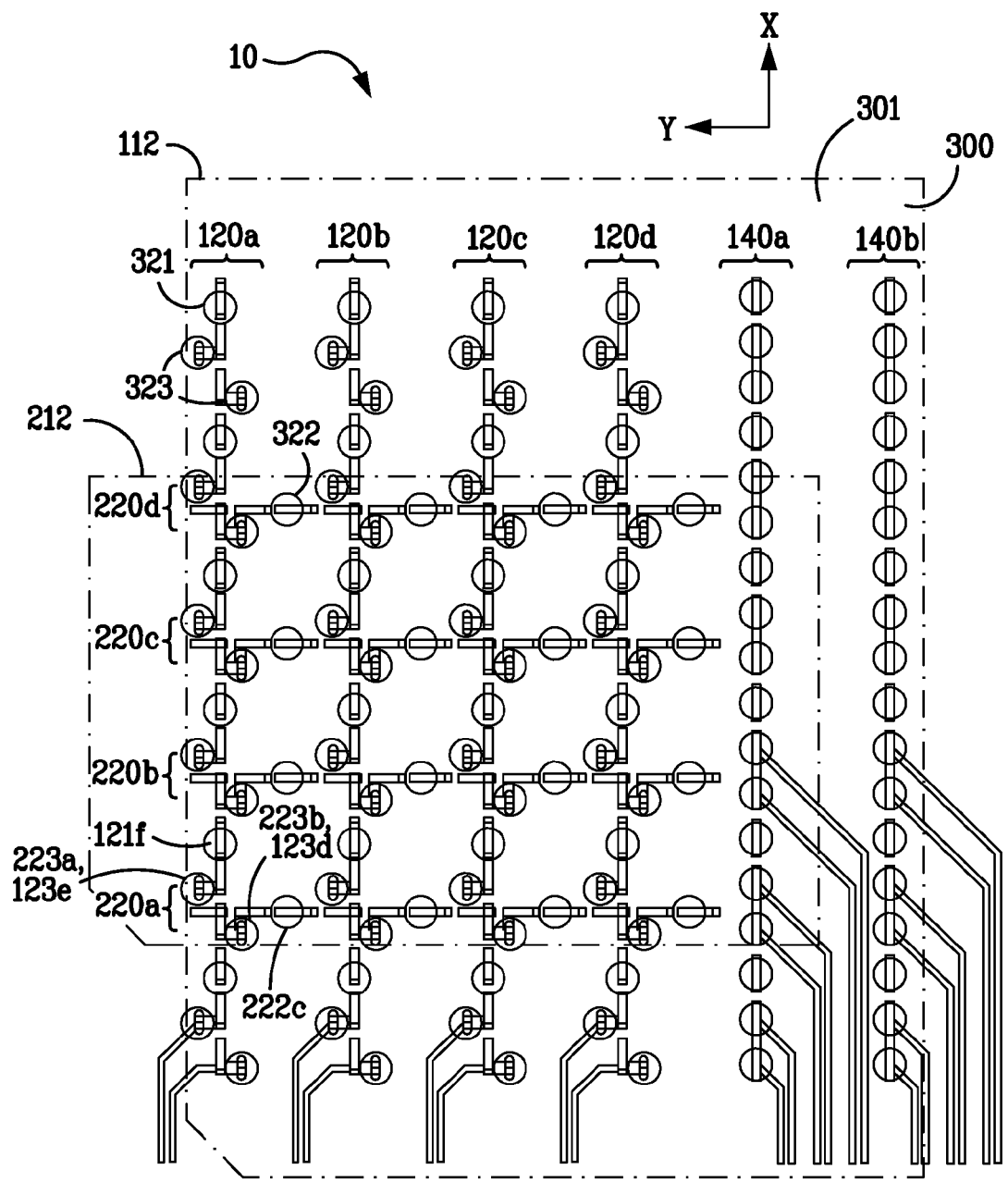
FIG. 8 depicts a transparent view through the midplane for the mounted connector pair, wherein each of the connectors is shown in dashed line.

FIG. 8 depicts a transparent view through the midplane for the mounted connector pair, wherein each of the connectors is shown in dashed line. FIG. 8, which is shown from the view of first side 301 of midplane 300, shows the details of the electrical mating between the orthogonal columns of contact tails 120 of mixed leadframe connector 100 (shown in FIG. 3) and the orthogonal columns of contact tails 220 of orthogonal leadframe connector 200 (shown in FIG. 4), through the shared use of the orthogonal pattern of vias 320 in midplane 300 (shown in FIG. 5). The outer boundaries of leadframe housings 110 and 210 are shown in dashed lines 112 and 212, respectively.

In this embodiment, the four orthogonal columns of contact tails 120a, 120b, 120c, and 120d of mixed leadframe connector 100 extend in the direction indicated by the arrow X of FIG. 1A. The four orthogonal columns of contact tails 220a, 220b, 220c, and 220d of orthogonal leadframe connector 200 extend in the direction indicated by the arrow Y of FIG. 1A. Also shown in FIG. 8 are two standard columns of contact tails 140a and 140b of mixed leadframe connector 100, which, in this embodiment, are not electrically connected to corresponding contact tails of orthogonal leadframe connector 200.

In the embodiment shown in FIG. 8, a mounted connector pair (or electrical connector system) may include a midplane 300 that defines a first side 301 and a second side 302 opposing the first side, an electrical connector 100 mounted on first side 301, and a second electrical connector 200 mounted on second side 302, wherein the first electrical connector 100 may include more contacts (any of 121, 123, 141, 143) than the second electrical connector 200 (either 222 or 223).

Mixed leadframe connector 100 and orthogonal leadframe connector 200 "share" a portion of the signal vias 323 within the orthogonal pattern of vias 320 defined by midplane 300. This allows electrical connection between the signal contact tails 123 from connector 100 and the signal contact tails 223 from connector 200. Conversely, in this embodiment, the ground vias 321 and 322 are not shared by both connector 100 and connector 200. The first side ground vias 321 only receive ground contact tails 121 from connector 100, at the first side 301, while the second side ground vias 322 only receive ground contact tails 222 from connector 200, at the second side 302.

In this embodiment, the signal contact tails 223 from connector 200 are capable of electrical connection to corresponding signal contact tails 123 from connector 100, through the use of the shared portion of the signal vias 323 in midplane 300. However, the number of signal contact tails 123 (from connector 100) exceeds the number of signal contact tails 223 (from connector 200). Therefore, some of the signal contact tails 123 from connector 100 are not electrically connected to corresponding signal contact tails 223 from connector 200. Instead, some of the signal vias 323 in midplane 300 only receive signal contact tails 123 from connector 100 at first side 301. Those signal vias 323 remain devoid of connection to connector 200, so those vias are not occupied at the second side 302.

Although in this embodiment, the signal contact tails 223 of connector 200 are electrically coupled to signal contact tails 123 of connector 100, this is optional. In other embodiments, some of the signal contact tails 223 may not be electrically connected to corresponding signal contact tails 123 from connector 100. In this situation, some of the signal vias 323 in midplane 300 only receive signal contact tails 223 from connector 200 at second side 302. Those signal vias 323 remain devoid of connection to connector 100, so those vias are not occupied at the first side 301. Also, the mismatching of the numbers of signal contact tails 123 and 223 (more signal contact tails 123 than 223) is optional. In other embodiments, the numbers of signal contact tails 123 and 223 may be equal.

In this embodiment, each orthogonal column of contact tails 120a, 120b, 120c, and 120d mates with each orthogonal column of contact tails 220a, 220b, 220c, and 220d, via one pair of signal contact tails 123 from connector 100 and one pair of signal contact tails 223 from connector 200. Also, each orthogonal column of contact tails 220a, 220b, 220c, and 220d mates with each orthogonal column of contact tails 120a, 120b, 120c, and 120d, via one pair of signal contact tails 223 from connector 200 and one pair of signal contact tails 123 from connector 100.

This embodiment provides an array of sixteen (16) pairs of signal contact tails 123 (four of the six pairs in each orthogonal column of contact tails 120a, 120b, 120c, and 120d) mated with the corresponding sixteen pairs of signal contact tails 223 (four pairs in each orthogonal column of contact tails 220a, 220b, 220c, and 220d). For example, orthogonal column of contact tails 120a from connector 100 contains signal contact tails 123d and 123e, which mates with signal contact tails 223a and 223b, respectively, contained in orthogonal column of contact tails 220a from connector 200, through shared signal vias 323 in midplane 300. Of course, the mating of specific signal vias 123 and 223 will vary, depending on the number and relative positioning of orthogonal columns of contact tails 120 from connector 100 and orthogonal columns of contact tails 220 from connector 200.

Figure 9:
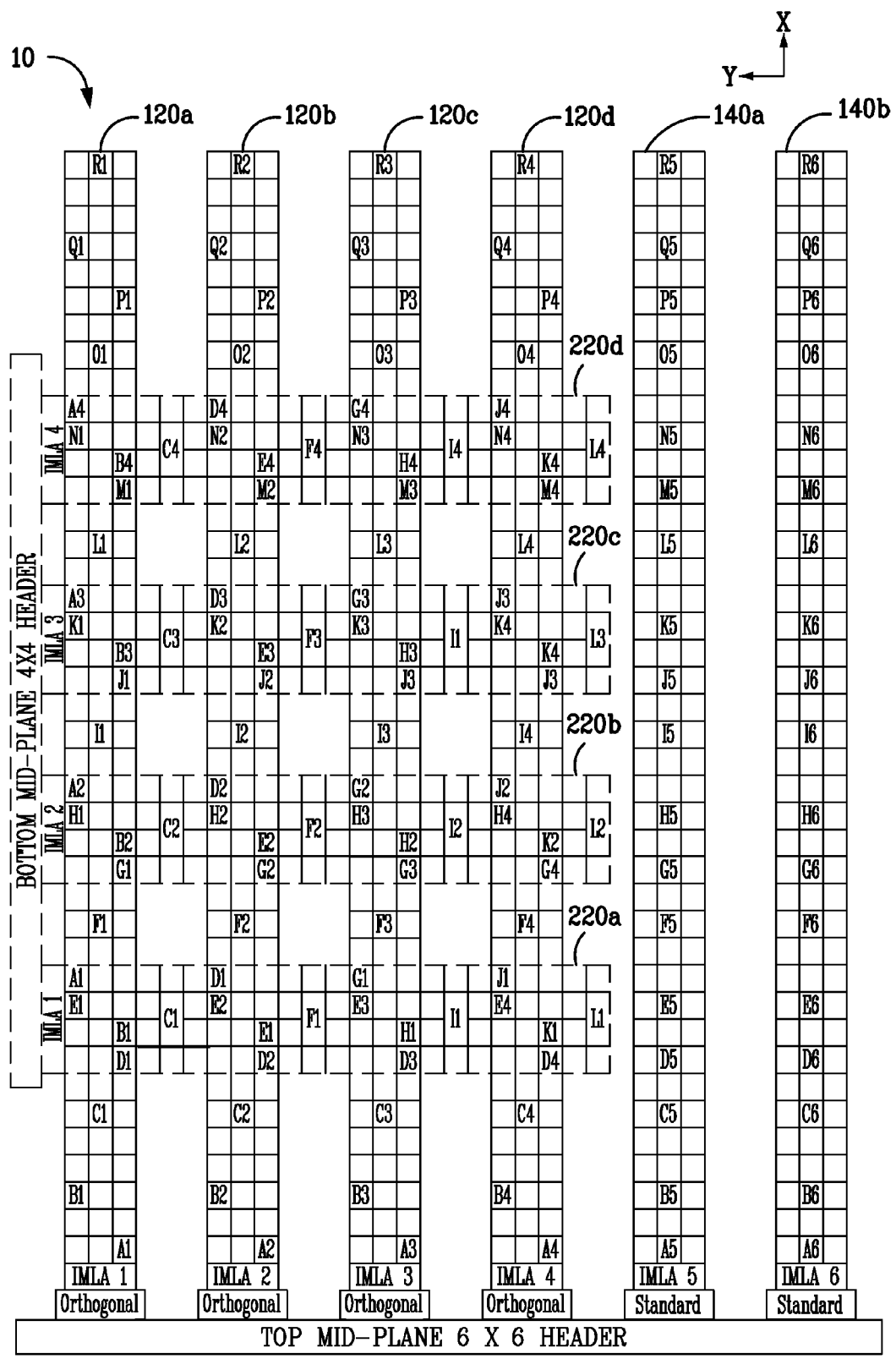
FIG. 9 depicts a pin-out diagram of the midplane for the mounted connector pair, wherein a 4×4 orthogonal connector is electrically connected to a 6×6 mixed connector.

FIG. 9 depicts a pin-out diagram of the midplane for the mounted connector pair, wherein a 4×4 orthogonal connector is electrically connected to a 6×6 mixed connector. FIG. 9, which is shown from the view of first side 301 of midplane 300, shows the details of the electrical mating between the orthogonal columns of contact tails 120a, 120b, 120c, and 120d of mixed leadframe connector 100 and the orthogonal columns of contact tails 220a, 220b, 220c, and 220d of orthogonal leadframe connector 200. FIG. 9 shows sixteen (16) pairs of signal contact tails 123 from mixed leadframe connector 100 mated with the corresponding sixteen pairs of signal contact tails 223 from orthogonal leadframe connector 200. Also shown in FIG. 9 are two standard columns of contact tails 140a and 140b of mixed leadframe connector 100, which, in this embodiment, are not electrically connected to corresponding contact tails of orthogonal leadframe connector 200.

Figure 10:
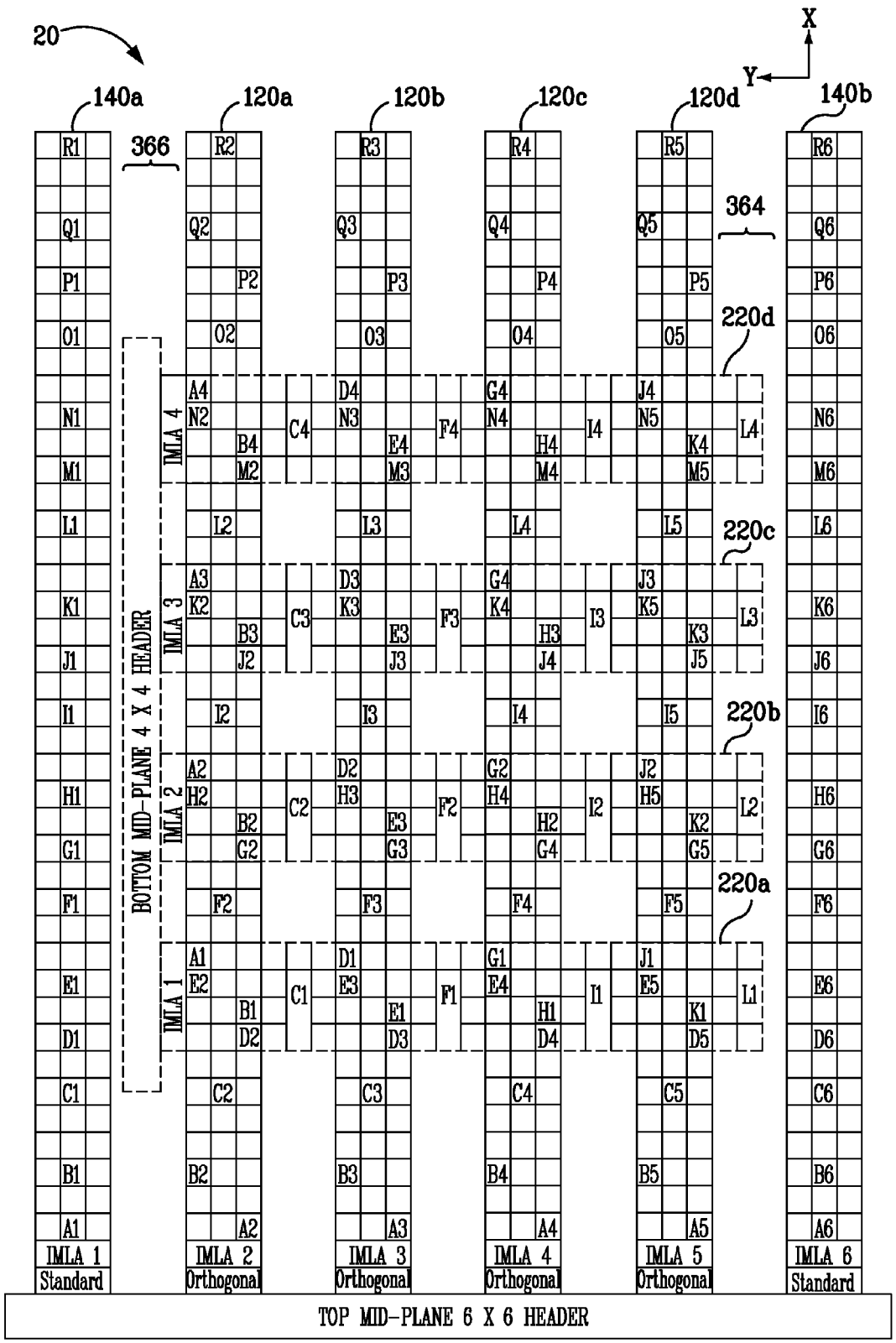
FIG. 10 depicts a pin-out diagram of the midplane for a second embodiment of the mounted connector pair, wherein a 4×4 orthogonal connector is electrically connected to a 6×6 mixed connector.

FIG. 10 depicts a pin-out diagram of the midplane for a second embodiment of the mounted connector pair, wherein a 4×4 orthogonal connector is electrically connected to a 6×6 mixed connector. FIG. 10, which is shown from the view of first side 301 of midplane 300, shows the details of the electrical mating between the orthogonal columns of contact tails 120a, 120b, 120c, and 120d of mixed leadframe connector 100 and the orthogonal columns of contact tails 220a, 220b, 220c, and 220d of orthogonal leadframe connector 200. FIG. 10 shows sixteen (16) pairs of signal contact tails 123 from mixed leadframe connector 100 mated with the corresponding sixteen pairs of signal contact tails 223 from orthogonal leadframe connector 200. Also shown in FIG. 10 are two standard columns of contact tails 140a and 140b of mixed leadframe connector 100, which, in this embodiment, are not electrically connected to corresponding contact tails of orthogonal leadframe connector 200.

This second embodiment, electrical connector system 20, is one of many alternatives to the first embodiment, wherein the order of orthogonal columns of contact tails 120 and standard columns of contact tails 140 within leadframe housing 110 of mixed leadframe connector 100 is different, and the relative position of the orthogonal pattern of vias 320 and standard columns of vias 340 in midplane 300 corresponds to the alternative position of the columns of contact tails 120 and 140.

In FIG. 10, the two standard columns of contact tails 140 within leadframe housing 110 are at opposite ends of leadframe housing 110, with the four orthogonal columns of contact tails 120 between the two standard columns of contact tails 140. Accordingly, the two standard columns of vias 340 in midplane 300 are at opposite ends of midplane 300, with the orthogonal pattern of vias 320 positioned in between the two standard columns of vias 340. As in the first embodiment electrical connector system 10, orthogonal leadframe connector 200 mates with mixed leadframe connector 100 through shared vias in midplane 300, but in electrical connector system 20, orthogonal leadframe connector 200 is approximately centered in the X-Y plane (as shown by the arrows designated X and Y in FIG. 1A) relative to mixed leadframe connector 100, wherein the sixteen (16) pairs of signal contact tails 223 in connector 200 mate with the 16 pairs of signal contact tails 123 in the center of mixed leadframe connector 100.

Although not shown in FIG. 10, this second embodiment contains an orthogonal via trace routing channel 364, which may be 0.87 millimeters, and which may accommodate orthogonal via traces 330 or standard via traces 350 on second side 302 of midplane 300. Orthogonal via trace routing channel 364 is located between the outer boundary of the orthogonal pattern of vias 320 and the inner boundary of standard column of vias 340b (not shown). Of course, via trace routing channel 364 may be any width, depending on the desired arrangement of signal contact tails 123 and 143 and on the desired anti-pad width.

This second embodiment also contains an additional trace routing channel 366, which may be greater than 0.87 millimeters, and which may accommodate either orthogonal via traces 330 or standard via traces 350 on the second side 302 or on any other layer of the PCB. Additional trace routing channel 366 is located between the outer boundary of the orthogonal pattern of vias 320 and the inner boundary of standard column of vias 340a (not shown).

Also, although not shown in FIG. 10, there may be additional trace routing space for more standard via traces 350 on second side 302 of midplane 300 to the outside of the outer boundary of leadframe housing 110 of connector 100 (not shown). In this embodiment, because there are two standard columns of vias 340 at opposite edges along the Y direction (as defined in FIG. 1A) of second side 302, there may be space for standard via traces 350 on second side 302 to the outside of each standard column of vias 340.

The combination of connectors 100 and 200 is not limited to the mating arrangements shown in the first and second embodiments (FIGS. 1A through 10). One way to create additional embodiments is to position orthogonal leadframe connector 200 anywhere on the X-Y plane relative to mixed leadframe connector 100, with the signal contact tails 123 in the orthogonal columns of contact tails 120 of connector 100 adapted to mate with the signal contact tails 223 in the orthogonal columns of contact tails 220 of connector 200, through the orthogonal pattern of vias 320 in midplane 300. For example, connector 200 may be moved positively or negatively along the X direction, relative to connector 100. In the first and second embodiments, there are three distinct positions that connector 200 can take relative to connector 100 (not shown). What is shown in FIGS. 1A through 10 is only one relative positioning of connectors 100 and 200.

Another way to create additional embodiments is to include different numbers of orthogonal columns of contact tails 120 and standard columns of contact tails 140 in connector 100, and to include different numbers of orthogonal columns of contact tails 220 in connector 200. Further, the order of the orthogonal columns of contact tails 120 and standard columns of contact tails 140 in connector 100 can be changed in various permutations, in addition to those of the first and second embodiments. Also, by varying the number of orthogonal columns of contact tails 120 and 220 and standard columns of contact tails 140, as well as the number of signal contact tails 123, 223, and 143 present in connectors 100 and 200, many different embodiments can be created.

Figure 11A:
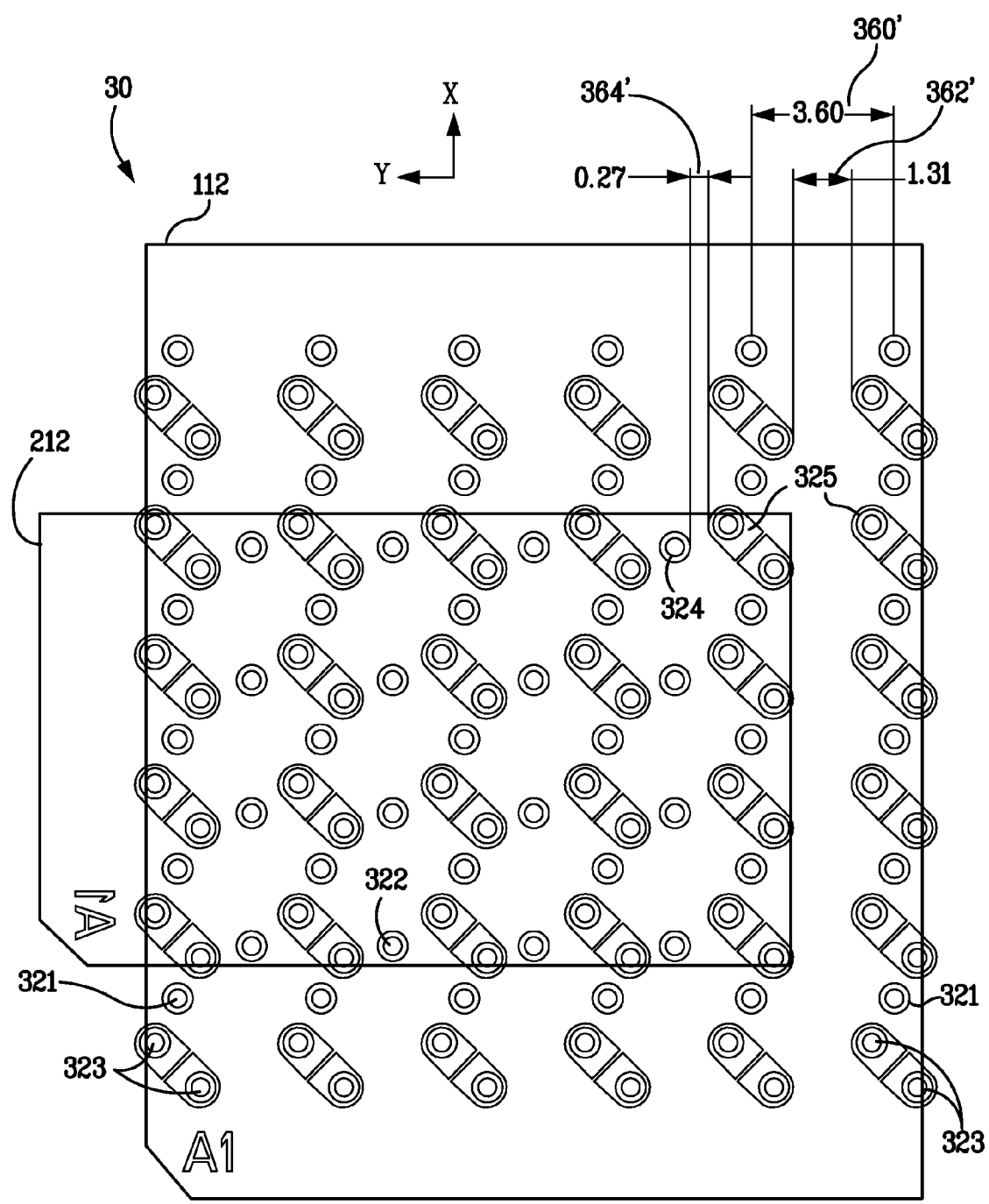
FIG. 11A depicts a midplane showing a footprint for a third embodiment of a 6×6 orthogonal connector, wherein the location of a 4×4 orthogonal connector on the opposite side is shown.

FIG. 11A depicts a midplane showing a footprint for a third embodiment of a 6×6 orthogonal connector, wherein the location of a 4×4 orthogonal connector on the opposite side is shown. The benefit of increased routing space for traces on the second side 302 or layers of midplane 300, shown in FIGS. 1A through 10, may also be realized in other embodiments of electrical connector system 10, such as the third embodiment, electrical connector system 30, depicted in FIGS. 11A and 11B. This third embodiment includes two orthogonal connectors: an orthogonal leadframe connector 100' and an orthogonal leadframe connector 200. The outer boundaries of leadframe housings 110 and 210 are shown in solid lines 112 and 212, respectively.

A difference between this third embodiment and the first and second embodiments may be the use of an orthogonal leadframe connector 100', rather than a mixed leadframe connector 100. Orthogonal leadframe connector 100' contains six (6) orthogonal columns of contact tails 120 within leadframe housing 110, and it may be devoid of any standard columns of contact tails 140. This alternative design may provide the benefits of increased routing space for traces on second side 302, because there are some signal vias 323 within the orthogonal pattern of vias 320 that are devoid of contact tails from connector 200 at the second side 302.

Figure 11B:
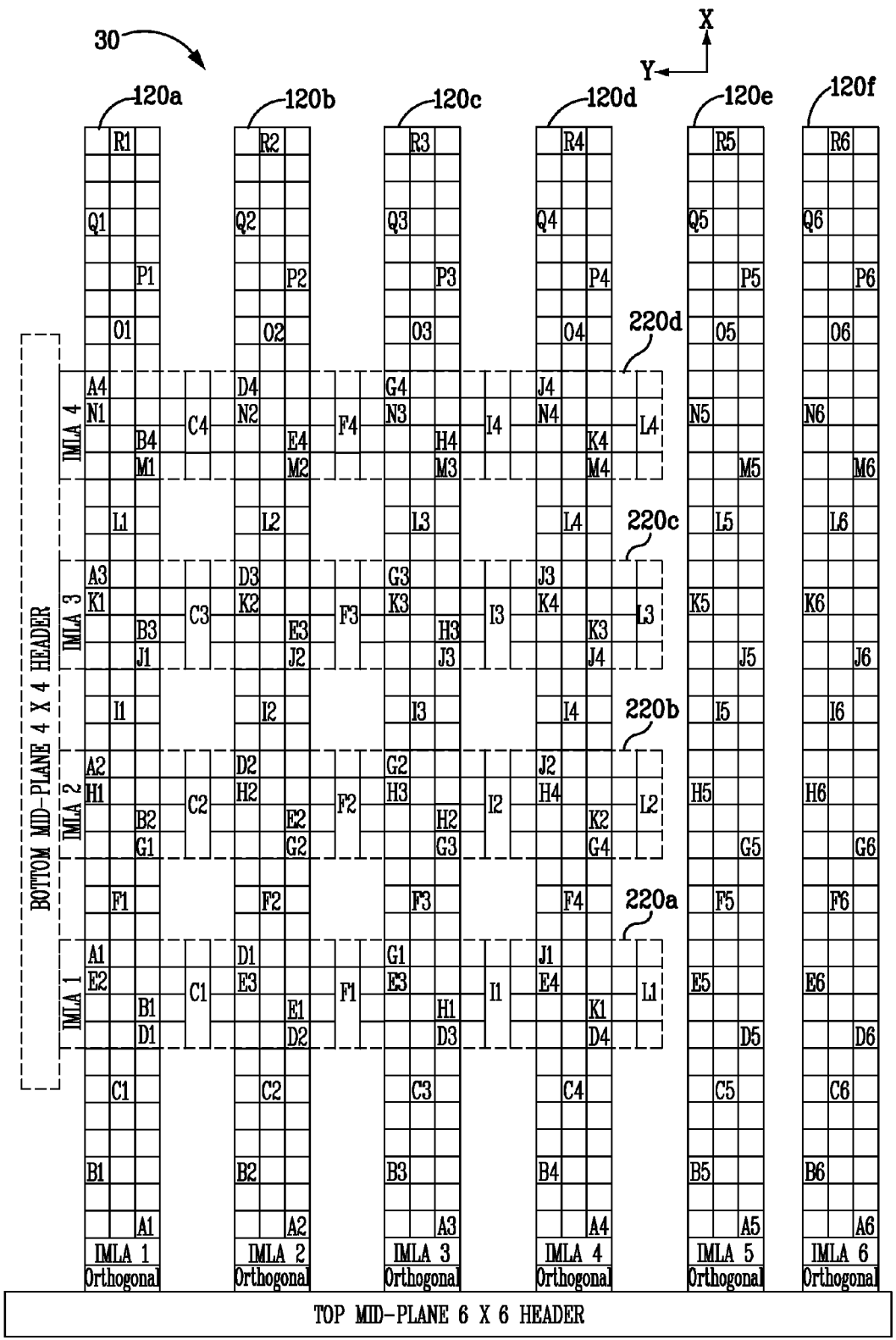
FIG. 11B depicts a pin-out diagram of the midplane for the third embodiment of FIG. 11A.

Although the design of electrical connector system 30, depicted in FIGS. 11A and 11B, may result in more narrow trace routing channels outside of the outer boundary of leadframe housing 210 (shown in solid line) on side 302, compared with the first embodiment (see the trace routing channel space in FIG. 7), these alternative embodiments have the added benefit of more flexibility in positioning of connector 200 relative to connector 100', as will be seen in FIGS. 11A through 13.

Also shown in FIG. 11A are alternate via trace routing channel 362' and orthogonal via trace routing channel 364'. In this embodiment, the alternate via column center spacing 360' shown in FIG. 11A may be the same as standard via column center spacing 360 shown in FIG. 7, which is 3.60 millimeters. However, the fact that leadframe housing 110 only contains orthogonal columns of contact tails 120 and may be devoid of standard columns of contact tails 140, and midplane 300 may be adapted to mate to these orthogonal columns of contact tails 120, may result in a more narrow alternate via trace routing channel 362' shown in FIG. 11A (1.31 millimeters) compared to the wider standard via trace routing channel 362 shown in FIG. 7 (2.51 millimeters). Also, the orthogonal via trace routing channel 364' shown in FIG. 11A (0.27 millimeters) may be much more narrow than the wider orthogonal via trace routing channel 364 shown in FIG. 7. However, the fact that this alternate via trace routing channel 362' may be devoid of any second side ground vias 322 (as can be seen in FIG. 11A, the second side ground vias 322 are all contained within the outer boundary of leadframe housing 210) may permit this channel 362' to be used for a plurality of alternate via traces 350' (not shown).

Also, although this is not shown in FIGS. 11A and 11B, there may be room for additional orthogonal via traces 330 towards the edges of midplane 300, running on the second side 302 or any other layer of the PCB outside the boundary of leadframe housing 210. In a manner similar to the first embodiment design shown in FIG. 6, the portion of the signal vias 323 that are devoid of receiving any contact tails at second side 302, from connector 200 (those that fall outside of the solid line that represents the outside boundaries of leadframe housing 210 of orthogonal leadframe connector 200) allow the corresponding signal contact tails 123 from connector 100' to be (optionally) electrically connected to respective orthogonal via traces 330 that originate from these respective signal vias 323.

FIG. 11B depicts a pin-out diagram of the midplane for the third embodiment depicted in FIG. 11A. FIG. 11B, which is shown from the view of first side 301 of midplane 300, shows the details of the electrical mating between the orthogonal columns of contact tails 120a, 120b, 120c, and 120d of orthogonal leadframe connector 100' and the orthogonal columns of contact tails 220a, 220b, 220c, and 220d of orthogonal leadframe connector 200. FIG. 11B shows sixteen (16) pairs of signal contact tails 123 from mixed leadframe connector 100' mated with the corresponding sixteen pairs of signal contact tails 223 from orthogonal leadframe connector 200. Also shown in FIG. 11B are two additional orthogonal columns of contact tails 120e and 120f of orthogonal leadframe connector 100', which, in this embodiment, are not electrically connected to corresponding contact tails of orthogonal leadframe connector 200.

Comparing FIGS. 9 and 11B, the difference between the first embodiment (electrical connector system 10) and the third embodiment (electrical connector system 30) can be seen. While there may be no difference between these two embodiments regarding the electrical coupling between the two connectors, system 10 contains mixed leadframe connector 100, which has two standard columns of contact tails 140, while system 30 contains mixed leadframe connector 100', which substitutes two additional orthogonal columns of contact tails 120 instead of the standard columns of contact tails 140. While this does not affect the electrical coupling between the two connectors, the space available for trace routing on second side 302 may be somewhat reduced because of the presence of the additional orthogonal columns of contact tails 120. However, the third embodiment gains additional flexibility with the relative positioning of connector 200, relative to connector 100'.

Figure 12:
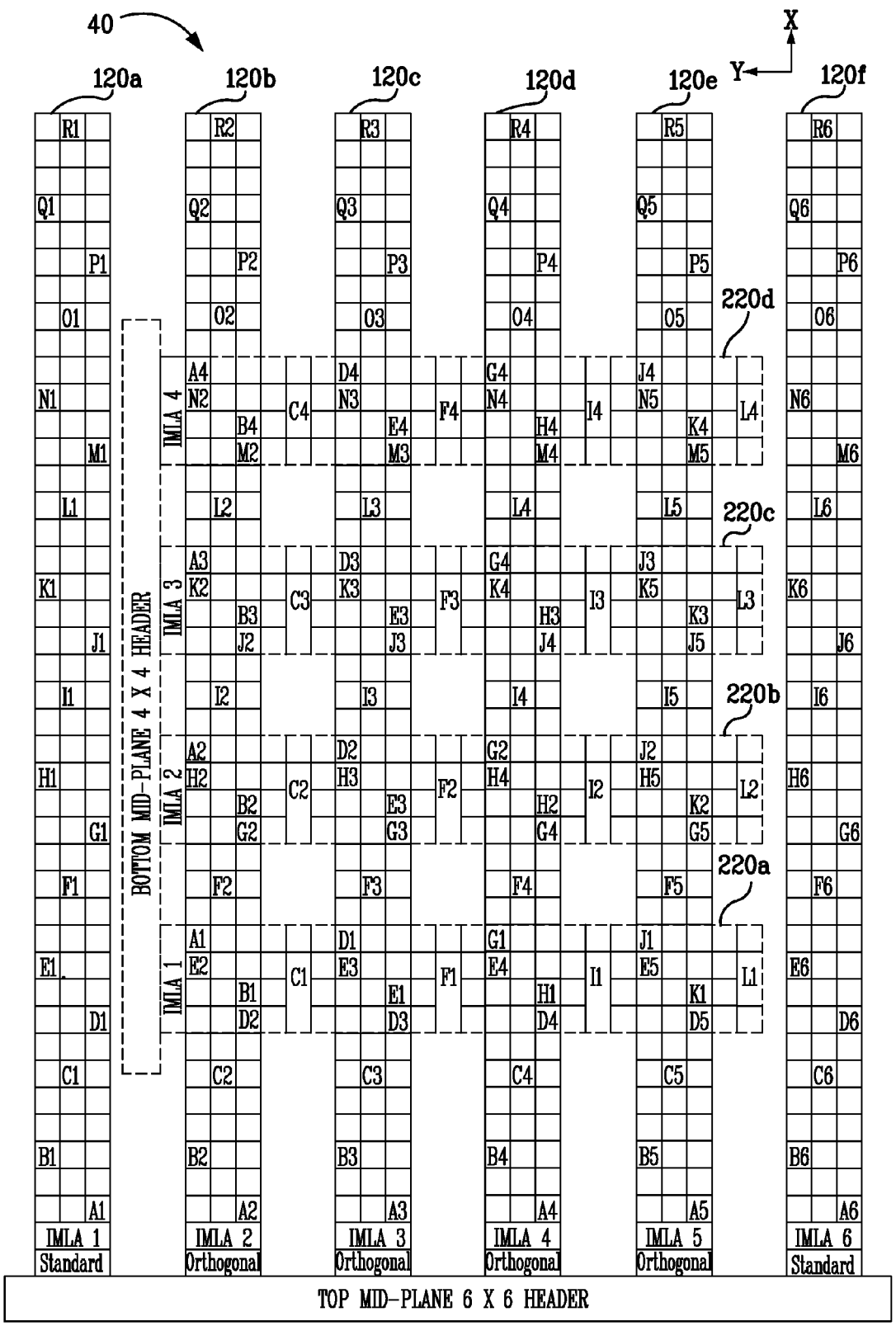
FIG. 12 depicts a pin-out diagram of the midplane for a fourth embodiment.

FIG. 12 depicts a pin-out diagram of the midplane for a fourth embodiment. FIG. 12, which is shown from the view of first side 301 of midplane 300, shows the details of the electrical mating between the orthogonal columns of contact tails 120b, 120c, 120d, and 120e of orthogonal leadframe connector 100' and the orthogonal columns of contact tails 220a, 220b, 220c, and 220d of orthogonal leadframe connector 200. FIG. 12 shows sixteen (16) pairs of signal contact tails 123 from mixed leadframe connector 100' mated with the corresponding sixteen pairs of signal contact tails 223 from orthogonal leadframe connector 200. Also shown in FIG. 12 are two additional orthogonal columns of contact tails 120a and 120f of orthogonal leadframe connector 100', which, in this embodiment, are not electrically connected to corresponding contact tails of orthogonal leadframe connector 200.

Comparing FIGS. 12 and 11B, the difference between the third embodiment (electrical connector system 30) and the fourth embodiment (electrical connector system 40) can be seen. There may be no difference between these two embodiments regarding the structure of the three main components: orthogonal leadframe connector 100', orthogonal leadframe connector 200, and midplane 300. However, there may be a difference in how these components are mated to each other. Rather than showing connector 200 mated to the center of orthogonal columns of contact tails 120a, 120b, 120c, and 120d from connector 100' (as shown in FIG. 11B), in system 40 that is shown in FIG. 12, connector 200 is shown mated with the center of orthogonal columns of contact tails 120b, 120c, 120d, and 120e from connector 100'.

Comparing FIGS. 12 and 10, the difference between the second embodiment (electrical connector system 20) and the fourth embodiment (electrical connector system 40) can be seen. While there may be no difference between these two embodiments regarding the electrical coupling between the two connectors, system 20 contains mixed leadframe connector 100, which has two standard columns of contact tails 140, while system 30 contains mixed leadframe connector 100', which substitutes two additional orthogonal columns of contact tails 120 instead of the standard columns of contact tails 140. While this does not affect the electrical coupling between the two connectors, the space available for trace routing on second side 302 may be somewhat reduced because of the presence of the additional orthogonal columns of contact tails 120. However, the fourth embodiment gains additional flexibility with the relative positioning of connector 200, relative to connector 100'.

Figure 13:
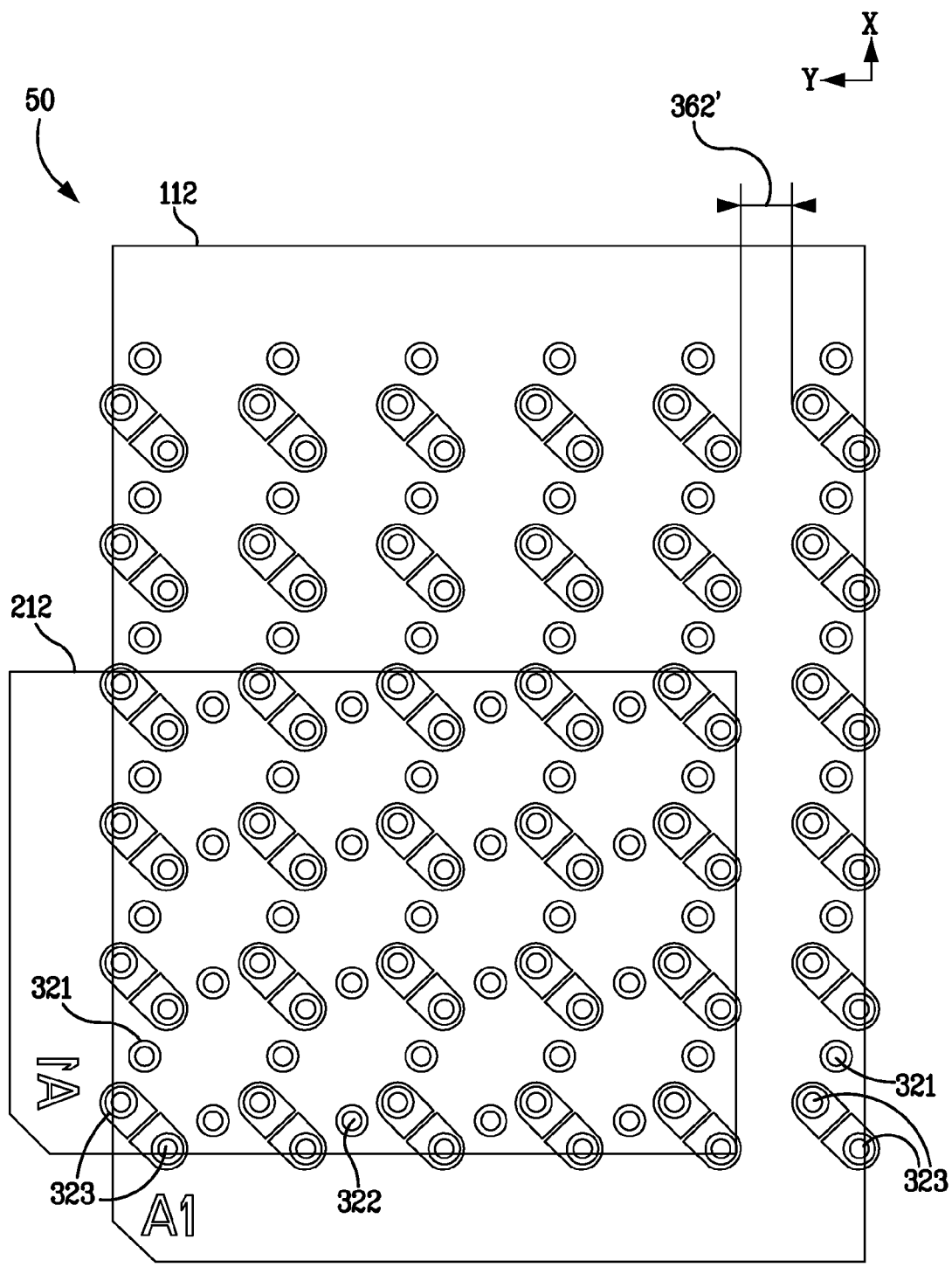
FIG. 13 depicts a midplane showing a footprint for a fifth embodiment of a 6×6 orthogonal connector, wherein the location of a 4×4 orthogonal connector on the opposite side is shown.

FIG. 13 depicts a midplane showing a footprint for a fifth embodiment of a 6×6 orthogonal connector, wherein the location of a 4×4 orthogonal connector on the opposite side is shown. FIG. 13, which is shown from the view of first side 301 of midplane 300, shows the details of the electrical mating between the orthogonal columns of contact tails 120 of orthogonal leadframe connector 100' and the orthogonal columns of contact tails 220 of orthogonal leadframe connector 200. FIG. 13 shows sixteen (16) pairs of signal contact tails 123 from mixed leadframe connector 100' mated with the corresponding sixteen pairs of signal contact tails 223 from orthogonal leadframe connector 200. The outer boundaries of leadframe housings 110 and 210 are shown in solid lines 112 and 212, respectively.

Comparing FIGS. 13 and 11A, the difference between the fifth embodiment (electrical connector system 50) and the third embodiment (electrical connector system 30) can be seen. There may be no difference between these two embodiments regarding the structure of the three main components: orthogonal leadframe connector 100', orthogonal leadframe connector 200, and midplane 300. However, there may be a difference in how these components are mated to each other. Rather than showing connector 200 mated to the center of orthogonal columns of contact tails 120a, 120b, 120c, and 120d from connector 100' (as shown in FIG. 11B), in system 50 that is shown in FIG. 13, connector 200 is moved in the negative X direction (as defined in FIG. 1A), so it is mated with one end of the same four orthogonal columns of contact tails 120a, 120b, 120c, and 120d from connector 100'. This embodiment may allow more trace routing space in the positive X direction, outside the outer boundaries of leadframe housing 210 (shown in solid line in FIG. 13), however there may be less trace routing space in the negative X direction, outside the outer boundaries of leadframe housing 210, on the second side 302 of midplane 300.

The combination of connectors 100' and 200 is not limited to the mating arrangements shown in the third, fourth, and fifth embodiments (FIGS. 11A through 13). Rather, these two connectors 100' and 200 can be mated through midplane 300 in many different ways, depending on where in the X-Y plane (defined in FIG. 1A) connector 200 is positioned relative to connector 100'. Further, by varying the number of orthogonal columns of contact tails 120 and 220, as well as the number of signal contact tails 123 and 223 present in connectors 100' and 200, many different embodiments can be created.

Figure 14A:
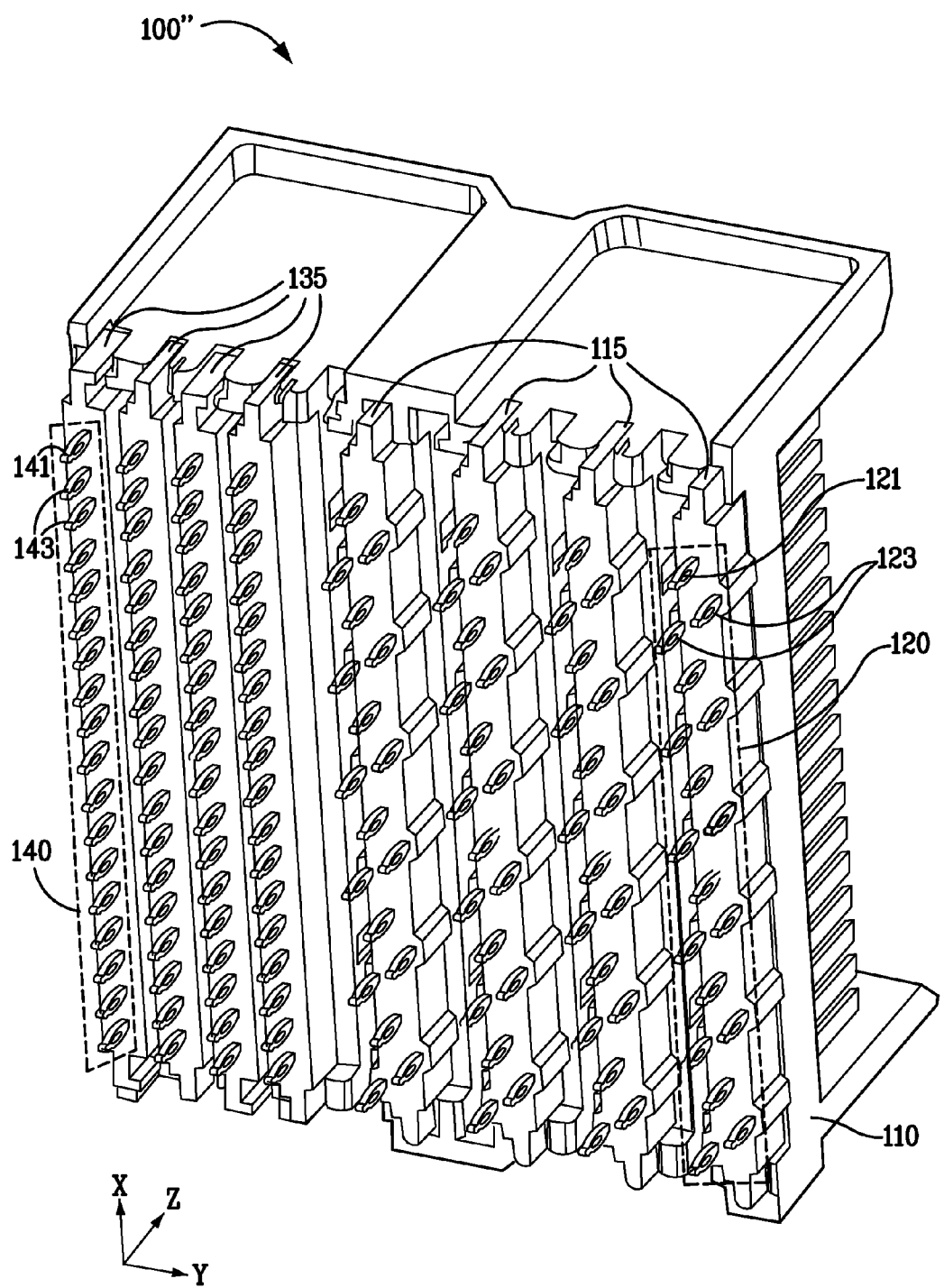
FIG. 14A depicts a perspective view of the mounting side of a sixth embodiment of an 8×6 mixed connector.

FIG. 14A depicts a perspective view of a mounting side of a sixth embodiment of an 8×6 mixed connector. In FIG. 14A, the mounting side of the four (4) orthogonal leadframe assemblies 115 and four (4) standard leadframe assemblies 135 can be seen, as they are positioned within leadframe housing 110 of 8×6 mixed leadframe connector 100". Each orthogonal leadframe assembly 115 includes an orthogonal column of contact tails 120. Each orthogonal column of contact tails 120 extends in the direction indicated by the arrow X of FIG. 1A and includes ground contact tails 121 and signal contact tails 123. Each standard leadframe assembly 135 includes a standard column of contact tails 140. Each standard column of contact tails 140 extends in the direction indicated by the arrow X of FIG. 1A and includes ground contact tails 141 and signal contact tails 143. Of course, the designation of the direction of columns is arbitrary.

The difference between this sixth embodiment connector 100" shown in FIG. 14A and the first embodiment connector 100 shown in FIG. 3 may be the presence of two additional standard leadframe assemblies 135. Otherwise, the included elements may be the same between the two connector embodiments.

Figure 14B:
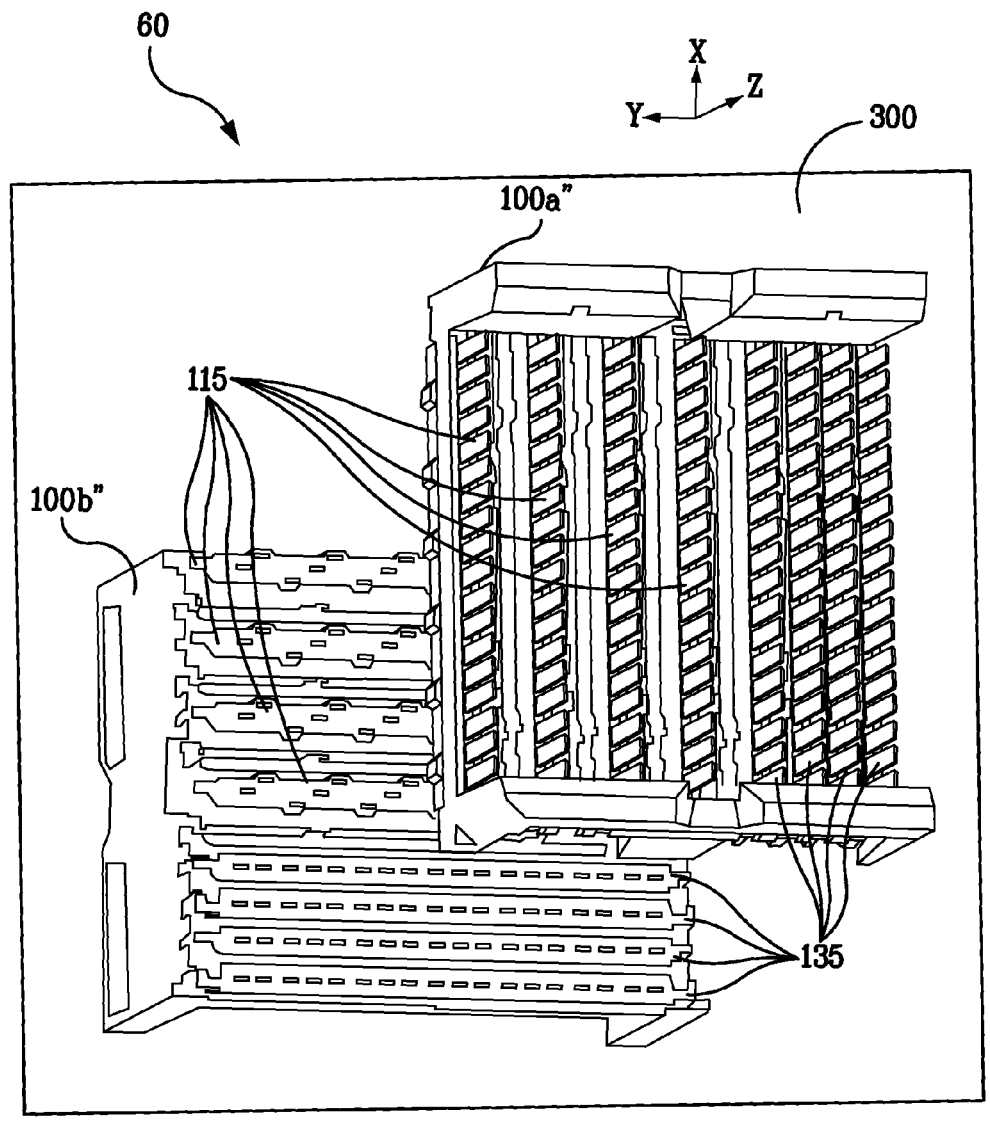
FIG. 14B depicts a perspective view of two 8×6 mixed connectors mounted orthogonally to one another through the use of shared vias in a transparent midplane.
Figure 14C:
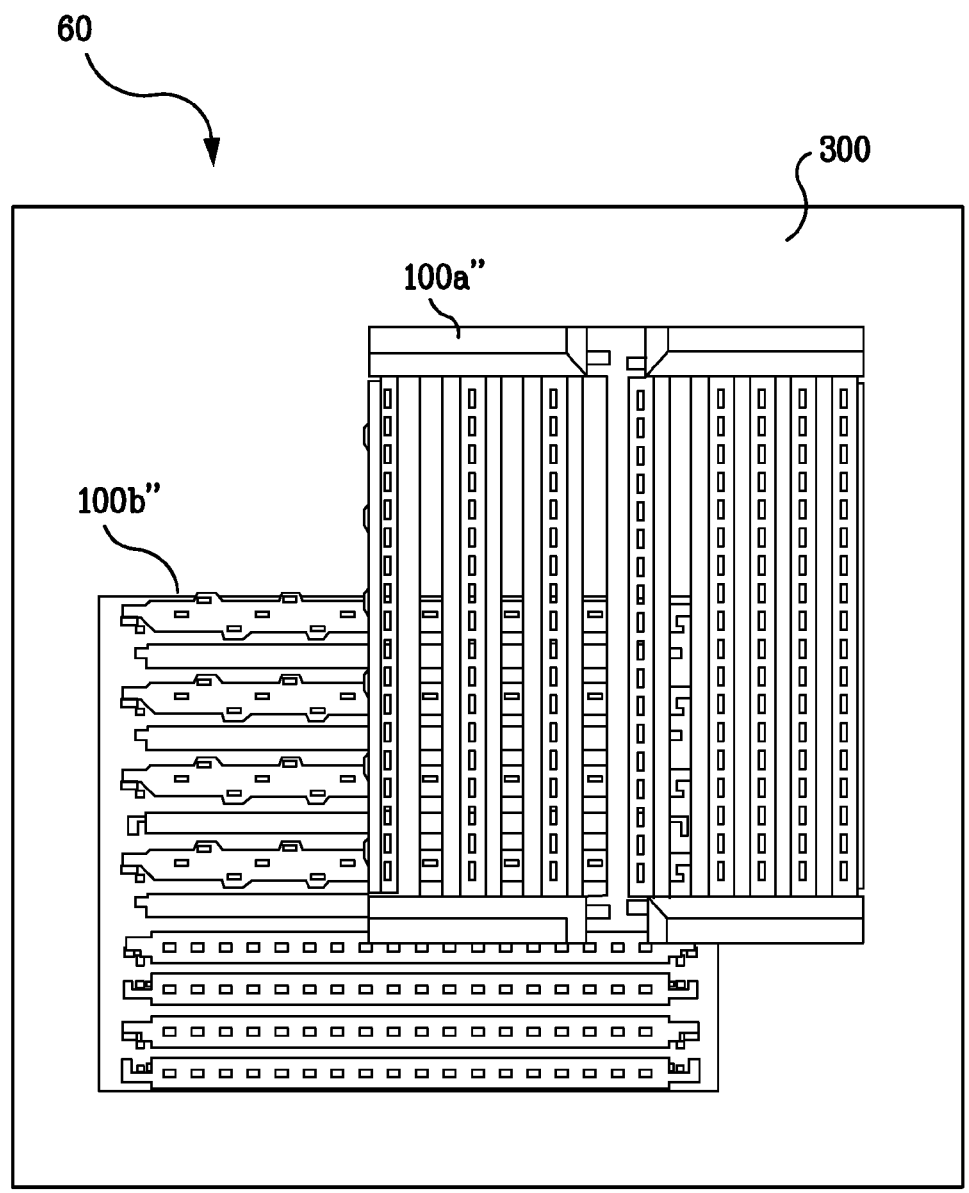
FIG. 14C depicts a top view of the sixth embodiment mounted connector pair of FIG. 14B.
Figure 14D:
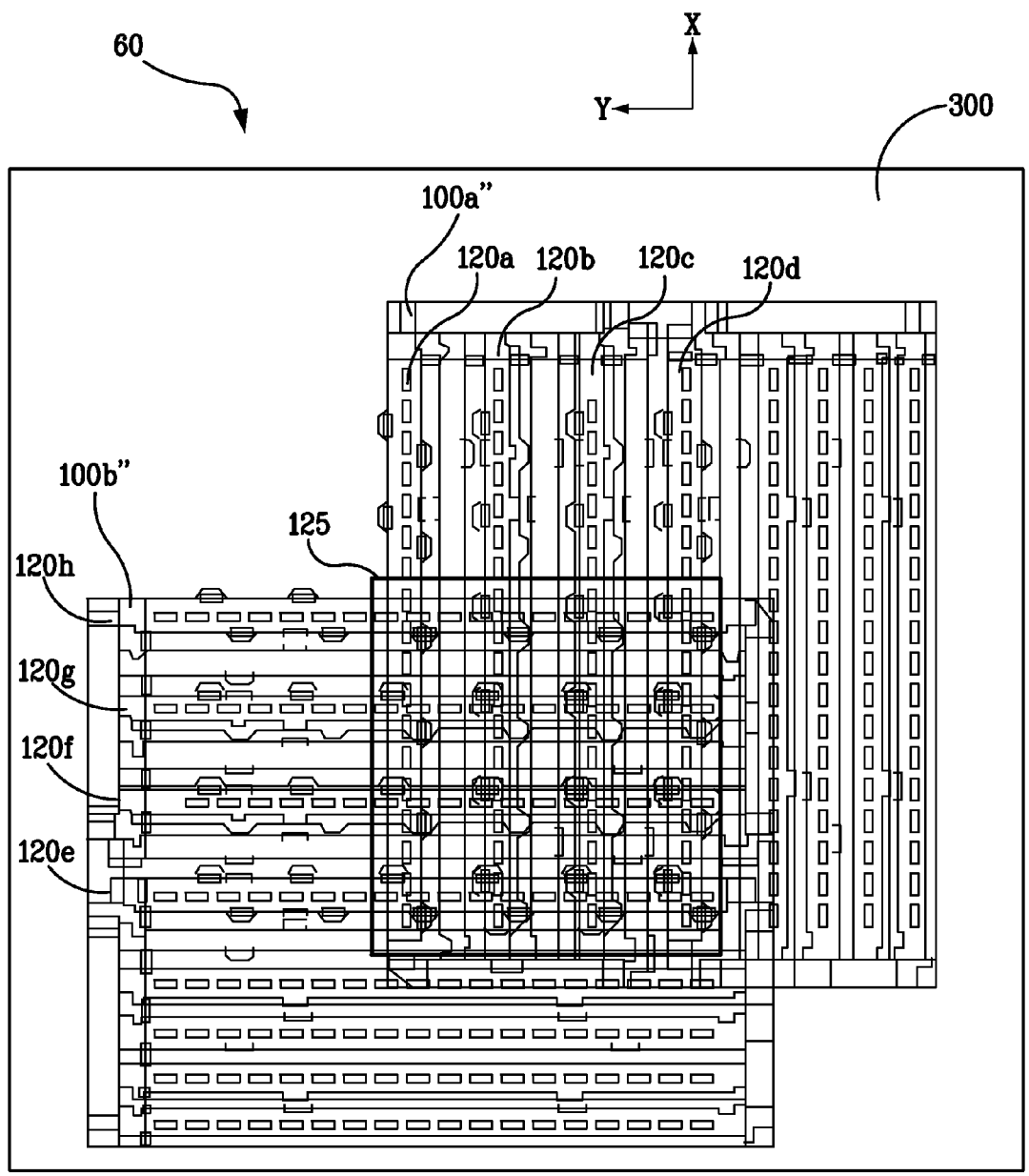
FIG. 14D depicts a transparent view through the midplane for the mounted connector pair of FIG. 14B, wherein each of the connectors is shown in solid line.
Figure 14E:
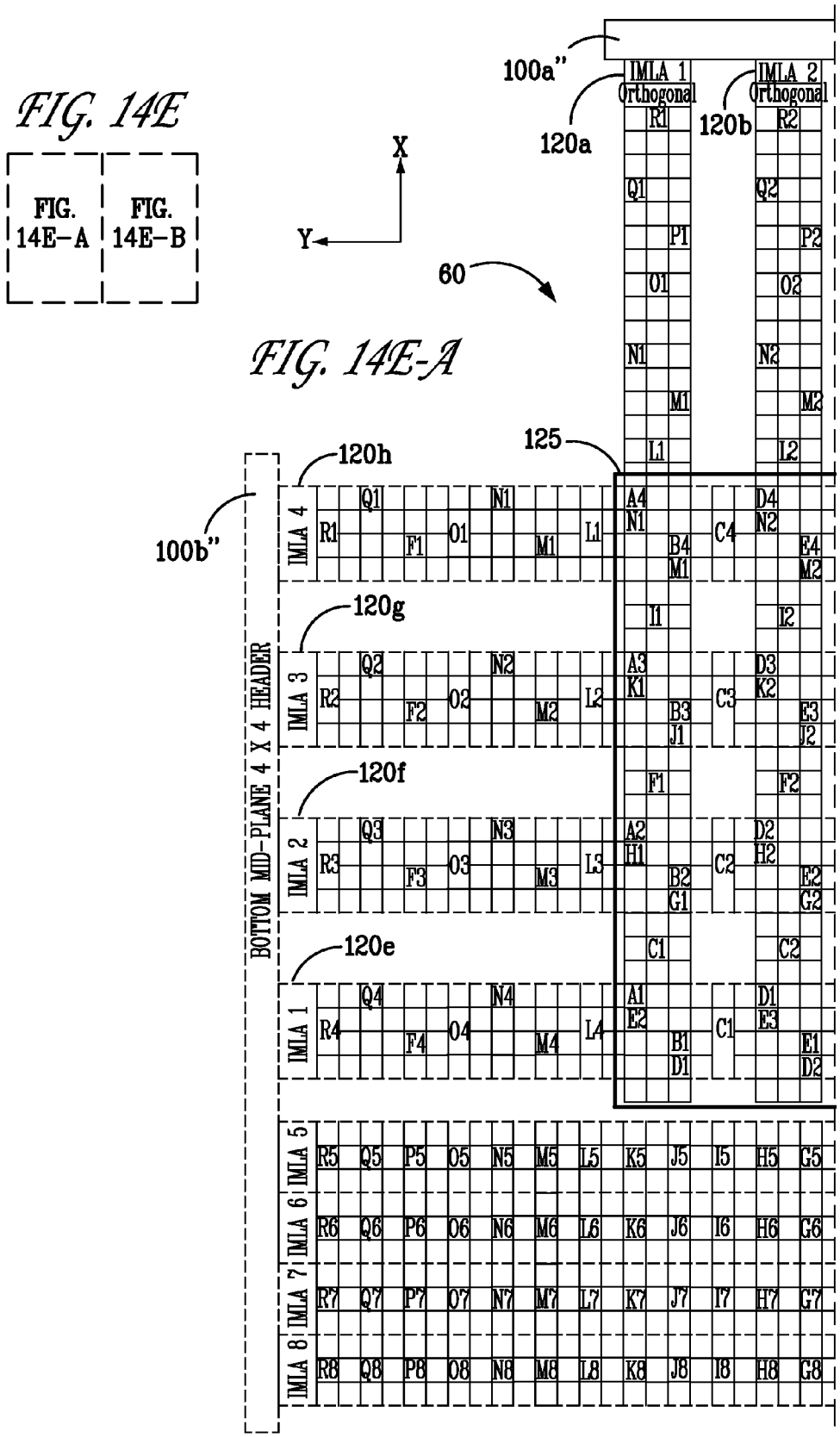
FIG. 14E depicts a pin-out diagram of the midplane for the sixth embodiment mounted connector pair of FIG. 14B.

FIG. 14B depicts a perspective view of two 8×6 mixed connectors mounted orthogonally to one another through the use of shared vias in a transparent midplane. FIG. 14C depicts a top view of the sixth embodiment mounted connector pair of FIG. 14B. FIG. 14D depicts a transparent view through the midplane for the mounted connector pair of FIG. 14B, wherein each of the connectors is shown in solid line. FIG. 14E depicts a pin-out diagram of the midplane for the sixth embodiment mounted connector pair of FIG. 14B.

Referring to FIG. 14B, an example sixth embodiment electrical connector system 60 includes two mixed leadframe connectors 100a" and 100b" (detail of the connectors 100" is shown in FIG. 14A) and a midplane 300. Midplane 300 defines a first side 301 and a second side 302. First side 301 and second side 302 include (optionally) orthogonal via traces 330 (not shown) and (optionally) standard via traces 350 (not shown). FIG. 14D, which is shown from the view of first side 301 of midplane 300, shows the details of the electrical mating between the orthogonal columns of contact tails 120 of mixed leadframe connectors 100" (shown in FIG. 14A), through the shared use of the orthogonal pattern of vias 320 (not shown) in midplane 300. In this embodiment, the four orthogonal columns of contact tails 120a, 120b, 120c, and 120d of mixed leadframe connector 100a" extend in the direction indicated by the arrow X. The four orthogonal columns of contact tails 120e, 120f, 120g, and 120h of mixed leadframe connector 100b" extend in the direction indicated by the arrow Y.

Mixed leadframe connectors 100" are mounted orthogonally (e.g., the first connector 100a" is rotated ninety degrees (90°) with respect to the second connector 100b") to one another through the use of the shared orthogonal pattern of vias 320 (not shown) in midplane 300. As shown in FIG. 14B, midplane 300 lies in a plane defined by the arrows designated X and Y. Mixed leadframe connector 100a" is mounted on first side 301 of midplane 300, extending away from midplane 300 in the positive direction indicated by the arrow Z. Mixed leadframe connector 100b" is mounted on second side 302 of midplane 300, extending away from midplane 300 in the negative Z direction, relative to mixed leadframe connector 100a".

Mixed leadframe connectors 100" "share" a portion of the signal vias 323 (not shown) within the orthogonal pattern of vias 320 defined by midplane 300. This allows electrical connection between signal contact tails 123 from connectors 100a" and 100b". Conversely, in this embodiment, ground vias 321 and 322 are not shared by both connector 100a" and connector 100b". First side ground vias 321 only receive ground contact tails 121 (not shown) from connector 100a", at first side 301, while second side ground vias 322 only receive ground contact tails 122 (not shown) from connector 100b", at second side 302.

In this embodiment, although there are equal numbers of signal contact tails 123 in connectors 100a" and 100b", some signal contact tails 123 from connector 100a" are not electrically connected to any corresponding signal contact tails 123 from connector 100b" (but they may be electrically connected to midplane 300), and some signal contact tails 123 from connector 100b" are not electrically connected to any corresponding signal contact tails 123 from connector 100a" (but they may be electrically connected to midplane 300). Instead, some of the signal vias 323 in midplane 300 only receive signal contact tails 123 from connector 100a" at first side 301 (therefore, these vias 323 are not occupied at second side 302), and some of the signal vias 323 in midplane 300 only receive signal contact tails 123 from connector 100b" at second side 302 (therefore, these vias 323 are not occupied at first side 301).

Although not shown in FIG. 14D, the portion of the signal vias 323 that are devoid of receiving any contact tails at second side 302, from connector 100b" (those that fall outside of mating region 125, which is the solid line that represents the outside boundaries of the sixteen mated pairs of signal contact tails 123 from each connector 100), allow the corresponding signal contact tails 123 from connector 100a" to be (optionally) electrically connected to respective orthogonal via traces 330 (on second side 302) that originate from these respective signal vias 323. Also, the portion of the signal vias 323 that are devoid of receiving any contact tails at first side 301, from connector 100a" (those that fall outside of mating region 125), allow the corresponding signal contact tails 123 from connector 100b" to be (optionally) electrically connected to respective orthogonal via traces 330 (on first side 301) that originate from these respective signal vias 323.

In this embodiment, each first side ground via 341 and signal via 343 within the standard columns of vias 340 (not shown) that may adapted to receive ground contact tails 141 and signal contact tails 143, from mixed leadframe connector 100a", may remain devoid of receiving a contact tail at second side 302, from mixed leadframe connector 100b". These standard columns of vias 340 may be used to mate with the standard columns of contact tails 140 from mixed leadframe connector 100a" (shown in FIG. 3), which is mounted at first side 301. Also, each second side ground via 342 and signal via 343 within the standard columns of vias 340 (not shown) that is adapted to receive ground contact tails 142 and signal contact tails 143, from mixed leadframe connector 100b", may remain devoid of receiving a contact tail at first side 301, from mixed leadframe connector 100a". These standard columns of vias 340 may be used to mate with the standard columns of contact tails 140 from mixed leadframe connector 100b", which is mounted at second side 302.

Although not shown in FIG. 14D, having some signal vias 343 within the standard columns of vias 340 (not shown) remain devoid of receiving any contact tails at second side 302, from connector 100b" (those that fall outside of mating region 125), may allow the corresponding signal contact tails 143 from connector 100a" to be (optionally) electrically connected to respective standard via traces 350 (on second side 302) that originate from these respective signal vias 343. Also, having some signal vias 343 within the standard columns of vias 340 (not shown) remain devoid of receiving any contact tails at first side 301, from connector 100a" (those that fall outside of mating region 125), may allow the corresponding signal contact tails 143 from connector 100b" to be (optionally) electrically connected to respective standard via traces 350 (on first side 301) that originate from these respective signal vias 343.

As can be seen in FIG. 14E, in this embodiment, each orthogonal column of contact tails 120a, 120b, 120c, and 120d from connector 100a" mates with each orthogonal column of contact tails 120e, 120f, 120g, and 120h from connector 100b", via one pair of signal contact tails 123 from connector 100a" and one pair of signal contact tails 123 from connector 100b". Also, each orthogonal column of contact tails 120e, 120f, 120g, and 120h from connector 100b" mates with each orthogonal column of contact tails 120*a*, 120*b*, 120*c*, and 120*d* from connector 100*a*", via one pair of signal contact tails 123 from connector 100*b*" and one pair of signal contact tails 123 from connector 100*a*". Mating region 125 is the solid line that represents the outside boundaries of the sixteen mated pairs of signal contact tails 123 from the connectors 100*a*" and 100*b*".)

As in embodiments one through five (FIGS. 1A through 13), this embodiment provides an array of sixteen (16) pairs of signal contact tails 123 (four of the six pairs in each orthogonal column of contact tails 120*a*, 120*b*, 120*c*, and 120*d* in connector 100*a*") mated with the corresponding sixteen pairs of signal contact tails 123 (four pairs in each orthogonal column of contact tails 120*e*, 120*f*, 120*g*, and 120*h* in connector 100*b*"). As can be seen in FIG. 14E, the mating between the 16 pairs of signal contact tails 123 from connectors 100*a*" and 100*b*" may have the same structure as the mating between the 16 pairs of signal contact tails 123 and 223 shown in FIG. 8.

Although in this embodiment, there are equal numbers of signal contact tails 123 in each connector 100, this matching of the numbers of signal contact tails 123 is optional. In other embodiments, the numbers of signal contact tails 123 in each connector 100 may be unequal. Also, connectors 100*a*" and 100*b*" may have any number of orthogonal leadframe assemblies 115 and standard leadframe assemblies 135, and each connector 100*a*" and 100*b*" may have the same or different numbers of orthogonal leadframe assemblies 115 and standard leadframe assemblies 135, relative to each other.

The foregoing description is provided for the purpose of explanation and is not to be construed as limiting the invention. While the invention has been described with reference to preferred embodiments or preferred methods, it is understood that the words which have been used herein are words of description and illustration, rather than words of limitation. Furthermore, although the invention has been described herein with reference to particular structure, methods, and embodiments, the invention is not intended to be limited to the particulars disclosed herein, as the invention extends to all structures, methods and uses that are within the scope of the appended claims. Those skilled in the relevant art, having the benefit of the teachings of this specification, may effect numerous modifications to the invention as described herein, and changes may be made without departing from the scope and spirit of the invention as defined by the appended claims.

What is claimed:

1. An electrical connector, comprising:
    a first differential signal pair including first and second contacts that have respective contact tails that are positioned on opposite sides of a first common centerline;
    a second differential signal pair including third and fourth contacts that have respective contact tails that are positioned along a second common centerline that is adjacent to the first common centerline; and
    a first housing that contains the first and second contacts and the third and fourth contacts, wherein the first differential signal pair and the second differential signal pair are positioned in the first housing;
    wherein when a second housing identical to the first housing, and having a third and fourth differential signal pair identical to the first and second differential signal pair, respectively, is inverted and rotated 90 degrees relative to the first housing for an orthogonal connection through a substrate, the first and third differential signal pairs are electrically connected to each other, while the second and fourth differential signal pairs are not electrically connected to each other.

2. The electrical connector of claim 1, wherein the first differential signal pair is positioned on a first leadframe assembly, and the second differential signal pair is positioned on a second leadframe assembly.

3. The electrical connector of claim 2, wherein the first leadframe assembly further includes a fifth ground contact adjacent the second contact.

4. The electrical connector of claim 2, wherein the second leadframe assembly further includes a sixth ground contact adjacent the fourth contact.

5. The electrical connector of claim 1, wherein the electrical connector is devoid of any metallic plates between the first differential signal pair and the second differential signal pair.

6. The electrical connector of claim 1, wherein the first leadframe assembly or the second leadframe assembly comprises two dielectric sections that fit together.

7. The electrical connector of claim 1, wherein the first differential signal pair connects orthogonally to the third differential signal pair by common via holes of the substrate.

8. The electrical connector of claim 2, further comprising a third leadframe assembly having respective in-line contact tails, wherein the in-line contact tails of the third leadframe assembly are positioned along a third common centerline that adjacent to the first common centerline, such that the first common centerline is disposed between the second common centerline and the third common centerline.

9. The electrical connector of claim 2, further comprising a third leadframe assembly having respective in-line contact tails, wherein the in-line contact tails of the third leadframe assembly are positioned along a third common centerline that is adjacent to the second common centerline, such that the second common centerline is disposed between the first common centerline and the third common centerline.

* * * * *

UNITED STATES PATENT AND TRADEMARK OFFICE
CERTIFICATE OF CORRECTION

| | | |
|---|---|---|
| PATENT NO. | : 8,251,745 B2 | Page 1 of 1 |
| APPLICATION NO. | : 12/186064 | |
| DATED | : August 28, 2012 | |
| INVENTOR(S) | : Douglas M. Johnescu et al. | |

It is certified that error appears in the above-identified patent and that said Letters Patent is hereby corrected as shown below:

COL. 20, line 40, [CLAIM 8] after "that" and before "adjacent" insert -- is -- so that the claim reads "that is adjacent..."

Signed and Sealed this
Ninth Day of October, 2012

David J. Kappos
*Director of the United States Patent and Trademark Office*